(12) United States Patent
Park

(10) Patent No.: US 8,097,882 B2
(45) Date of Patent: Jan. 17, 2012

(54) ORGANIC EL DISPLAY AND METHOD OF FABRICATING COMPRISING PLURAL TFTS AND WITH CONNECTION ELECTRODE WRAPPED ON ORGANIC PATTERN

(75) Inventor: Jae-Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1342 days.

(21) Appl. No.: 11/016,785

(22) Filed: Dec. 21, 2004

(65) Prior Publication Data

US 2005/0145855 A1   Jul. 7, 2005

(30) Foreign Application Priority Data

Dec. 22, 2003  (KR) .................. 10-2003-0094457
Dec. 22, 2003  (KR) .................. 10-2003-0094458

(51) Int. Cl.
  *H01L 29/417*  (2006.01)
  *H01L 29/786*  (2006.01)
  *H01L 27/32*   (2006.01)
(52) U.S. Cl. ............ 257/72; 257/E29.117; 257/E29.292
(58) Field of Classification Search .......... 257/40, 257/59, 72, E51.022, E27.112, E27.113, 257/E27.117, E29.002, E29.003, E29.111, 257/E29.112, E29.113, E29.116, E29.117, 257/E29.118, E29.119, E29.12, E29.121, 257/E29.122, E29.273, E29.285, E29.286, 257/E29.287, E29.288, E29.289, E29.29, 257/E29.291, E29.292, E29.293, E29.294
See application file for complete search history.

(56) References Cited

U.S. PATENT DOCUMENTS

| 2002/0000576 A1* | 1/2002 | Inukai ............................ 257/202 |
| 2002/0047120 A1* | 4/2002 | Inukai ............................. 257/59 |
| 2003/0205973 A1* | 11/2003 | Park et al. .................. 315/169.1 |
| 2004/0135520 A1* | 7/2004 | Park et al. .................. 315/169.3 |

FOREIGN PATENT DOCUMENTS

| CN | 1168538 | 12/1997 |
| CN | 1403854 | 3/2003 |
| JP | 10-154816 | 6/1998 |
| JP | 2000-214800 | 8/2000 |
| JP | 2000-221903 | 8/2000 |
| JP | 2001-291588 | 10/2001 |
| JP | 2002-287698 | 10/2002 |
| JP | 2003-058107 | 2/2003 |
| JP | 2003-208108 | 7/2003 |
| KR | 2000-0071311 | 11/2000 |
| WO | 01/06484 | 1/2001 |

* cited by examiner

*Primary Examiner* — Samuel Gebremariam
*Assistant Examiner* — Andrew O. Arena
(74) *Attorney, Agent, or Firm* — Morgan, Lewis & Bockius LLP

(57) ABSTRACT

An organic electroluminescent device includes first and second substrates facing and spaced apart from each other; a gate line on the first substrate; a data line intersecting the gate line to define a pixel region; a switching element connected to the gate line and the data line; an organic electroluminescent diode on the second substrate; and a driving element connected to the switching element and the organic electroluminescent diode, the driving element including a plurality of driving negative-type polycrystalline silicon thin film transistors connected to the organic electroluminescent diode in parallel.

39 Claims, 23 Drawing Sheets

ORGANIC EL DISPLAY AND METHOD OF FABRICATING COMPRISING PLURAL TFTS AND WITH CONNECTION ELECTRODE WRAPPED ON ORGANIC PATTERN

The present invention claims the benefit of the Korean Patent Applications No. 2003-0094457 filed in Korea on Dec. 22, 2003 and No. 2003-0094458 filed in Korea on Dec. 22, 2003, which are hereby incorporated by reference.

BACKGROUND OF THE INVENTION

1. Field of the Invention

The present invention relates to an organic electroluminescent device, and more particularly, to an organic electroluminescent device using a plurality of thin film transistors as driving elements and a method of fabricating the same.

2. Discussion of the Related Art

In general, organic electroluminescent (EL) devices emit light by injecting electrons from a cathode and holes from an anode into a luminescent layer, combining the electrons and the holes to generate an exciton, and transitioning the exciton from an excited state to a ground state. Contrary to liquid crystal display (LCD) devices, an additional light source is not necessary for the organic EL devices because the transition of the exciton between two states causes light to be emitted from the luminescent layer. Accordingly, size and weight of the organic EL devices can be reduced. Since the organic EL devices have low power consumption, superior brightness, and fast response time, the organic EL devices are incorporated in various consumer electronic products, such as cellular phones, car navigation system (CNS), personal digital assistants (PDA), camcorders, and palmtop computers. Moreover, since fabrication of the organic EL devices is simple, the production cost for the organic EL devices is lower than the LCD devices.

Organic EL devices may be categorized into two groups: passive matrix organic EL devices and active matrix organic EL devices. Although the passive matrix organic EL devices have a simpler structure and are disposed using simple fabricating processes, the passive matrix organic EL devices have some disadvantages. The passive matrix organic EL devices require relatively high amounts of power to operate the devices, and display sizes of the passive matrix organic EL devices are limited by their structures. In addition, as a total number of conductive line increases, aperture ratios of the passive matrix organic EL devices decrease. In contrast, the active matrix organic EL devices have a high luminescent efficiency and can produce high-quality images for increased-size displays using relatively low power.

FIG. 1 is a schematic cross-sectional view of an organic electroluminescent device according to the related art. In FIG. 1, an array unit 14 including a thin film transistor (TFT) "T" is formed on a first substrate 12. A first electrode 16, an organic luminescent layer 18, and a second electrode 20 are sequentially disposed on the array unit 14, wherein portions of the organic luminescent layer 18 may separately display red, green, and blue colors for each pixel region "P." In general, separate organic materials are provided to emit light corresponding to the colors red, green, and blue in each pixel region "P" provided in the organic luminescent layer 18. An organic EL device is encapsulated by attaching the first substrate 12 and a second substrate 28, which includes a moisture absorbent material 22, with a sealant 26. The moisture absorbent material 22 eliminates any moisture and oxygen that may penetrate into a capsule of the organic luminescent layer 18. A portion of the second substrate 28 is etched to create a room for the moisture absorbent material 22. The etched portion is filled with the moisture absorbent material 22 and is fixed by a holding element 25.

FIG. 2 is an equivalent circuit diagram showing a single pixel region of an organic electroluminescent device according to the related art. In FIG. 2, a switching element "$T_S$" is connected to a gate line 34 and a data line 36 intersecting each other and a driving element "$T_D$" is connected to the switching element "$T_S$." The driving element "$T_D$" is a positive (P) type thin film transistor (TFT) and a storage capacitor "$C_{ST}$" is connected to a driving gate electrode 40 and a driving source electrode 42. In addition, an organic electroluminescent (EL) diode "E" is connected to a driving drain electrode 44 and a power line 46 is connected to the driving source electrode 42 of the driving element "$T_D$."

When a gate signal is applied to a switching gate electrode 38 of the switching element "$T_S$" through the gate line 34, the switching element "$T_S$" is turned on and a data signal of the data line 36 is stored in the storage capacitor "$C_{ST}$" through the switching element "$T_S$." The data signal is also applied to the driving gate electrode 40, thereby turning the driving element "$T_D$" on. Thus, a current of the power line 46 flows through a channel of the driving element "$T_D$" and is transmitted to the organic EL diode "E." As a result, the organic EL diode "E" emits light in proportion to the current density. The organic EL diode "E" is a current driving type which is implemented to received fixed power voltage supplied from the power line 46, and the brightness of light is controlled by the current. Since the driving element "$T_D$" is driven by charges stored in the storage capacitor "$C_{ST}$," the current through the organic EL diode "E" is persistent until a next data signal is applied even when the switching element "$T_S$" is turned off. As a result, light is emitted from the organic EL diode "E" until a data signal of the next frame is applied.

The switching element "$T_S$" and the driving element "$T_D$" are formed of an amorphous silicon thin film transistor (TFT) or a polycrystalline silicon TFT. The amorphous silicon TFT may be fabricated easier than the polycrystalline silicon TFT. When the amorphous silicon TFT is used as the switching element "$T_S$" and the driving element "$T_D$," an increased width to length (W/L) ratio of the amorphous silicon TFT is required for an increased current density. However, the amorphous silicon TFT having the increased W/L ratio may be deteriorated due to a stress resulting from the increased current density. Specifically, since a direct current (DC) bias is continuously applied to the driving element "$T_D$," characteristics of the driving element "$T_D$" may vary widely. Accordingly, the deterioration of the driving element "$T_D$" causes a dot defect of an organic EL device.

Moreover, in an organic EL device according to the related art, an array unit and an organic EL diode are formed on a first substrate, and an additional second substrate is attached to the first substrate to encapsulate the organic EL device. However, when the array unit and the organic EL diode are formed on single substrate in this manner, production yield of the organic EL device is determined by a multiplication of the TFT's yield and the organic EL diode's yield. Since the organic EL diode has a relatively low yield, overall production yield of the EL device is limited by the organic EL diode's yield. For example, even when a TFT is well fabricated, an organic EL device using an organic luminescent layer of about 1000 Å thickness may be viewed as a poor example when an organic EL layer is defected. This results in loss of materials and increase in production costs.

Furthermore, organic EL devices are classified into bottom emission types and top emission types according to an emission direction of light used for displaying images via the organic EL devices. Bottom emission type organic EL devices have the advantages of high encapsulation stability and high process flexibility. However, the bottom emission type organic EL devices are ineffective for high resolution devices because they have poor aperture ratios. In contrast, top emission organic EL devices have an increased expected life span because they can be designed more easily and have an increased aperture ratio. However, top emission type organic EL devices generally include an organic EL layer having the cathode formed thereon. As a result, transmittance and optical efficiency of the top emission type organic EL devices are reduced because of a limited number of materials that may be selected. If a thin film-type passivation layer is disposed to prevent a reduction of the light transmittance, the thin film-type passivation layer may fail to prevent infiltration of exterior air into the device.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention is to provide an organic electroluminescent device using a plurality of negative type polycrystalline silicon thin film transistors as a driving element, and a method of fabricating the same.

Another object of the present invention is to provide a dual plate type organic electroluminescent display device having an array element substrate and an organic electroluminescent diode substrate, and a method of fabricating the same.

Another object of the present invention is to provide an organic electroluminescent device having an improved production yield, an increased resolution, an increased aperture ratio, an increased brightness, and a method of fabricating the same.

Another object of the present invention is to provide an organic electroluminescent display device including a driving element stabilized by distribution of a stress, and a method of fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device including first and second substrates facing and spaced apart from each other; a gate line on the first substrate; a data line intersecting the gate line to define a pixel region; a switching element connected to the gate line and the data line; an organic electroluminescent diode on the second substrate; and a driving element connected to the switching element and the organic electroluminescent diode, the driving element including a plurality of driving negative-type polycrystalline silicon thin film transistors connected to the organic electroluminescent diode in parallel.

In another aspect, a fabricating method of an organic electroluminescent device including disposing a gate line on a first substrate; disposing a data line intersecting the gate line to define a pixel region; forming a switching element on the first substrate connected to the gate line and the data line; forming an organic electroluminescent diode on a second substrate; forming a driving element on the first substrate connected to the switching element and the organic electroluminescent diode, and the driving element including a plurality of driving negative-type polycrystalline silicon thin film transistors connected to the organic electroluminescent diode in parallel; and attaching the first and second substrates such that the driving element is electrically connected to the organic electroluminescent diode.

In another aspect, the fabricating method of an organic electroluminescent device including disposing a switching active layer and a driving active layer on a first substrate, the driving active layer including a plurality of openings; disposing at least one switching gate electrode over the switching active layer, a driving gate electrode over the driving active layer and a gate line connected to the at least one switching gate electrode, the driving gate electrode crossing the plurality of openings; doping side portions of the driving active layer with negative type impurities; disposing a switching source electrode, a switching drain electrode, a driving source electrode, a driving drain electrode and a data line intersecting the gate line to define a pixel region, the switching source electrode and the switching drain electrode contacting side portions of the switching active layer, the driving source electrode, and the driving drain electrode contacting the side portions of the driving active layer, the data line being connected to the switching source electrode; disposing a first electrode on a second substrate; disposing an organic luminescent layer on the first electrode; disposing a second electrode on the organic luminescent layer; an attaching the first and second substrates such that the driving drain electrode is electrically connected to the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
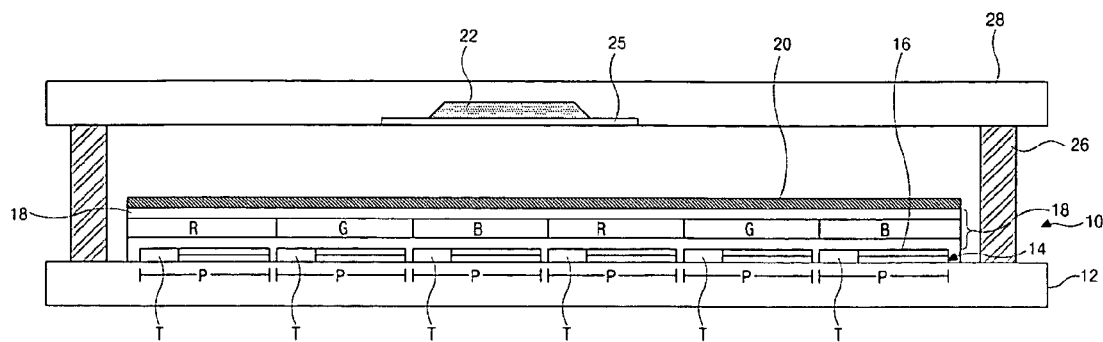
FIG. 1 is a schematic cross-sectional view of an organic electroluminescent device according to the related art.
Figure 2:
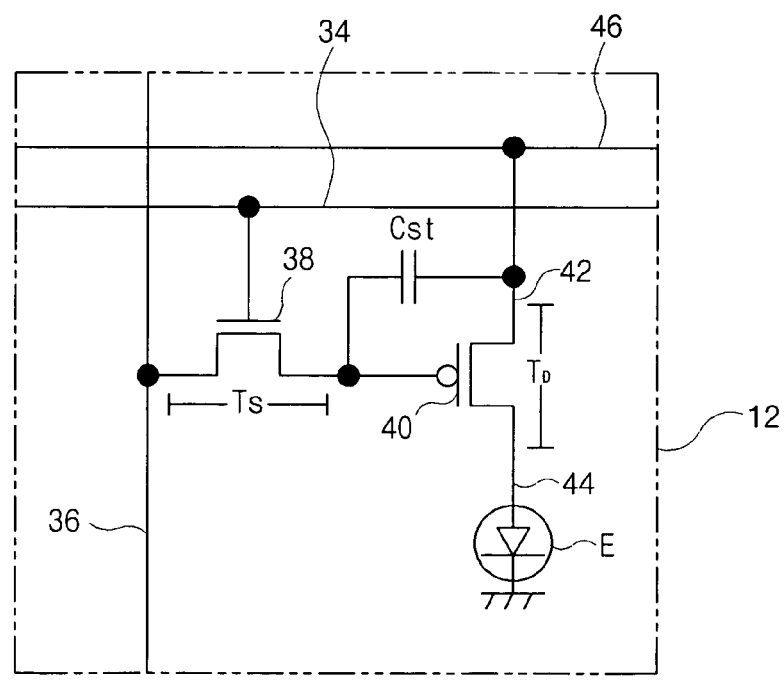
FIG. 2 is an equivalent circuit diagram showing a single pixel region of an organic electroluminescent device according to the related art.
Figure 3:
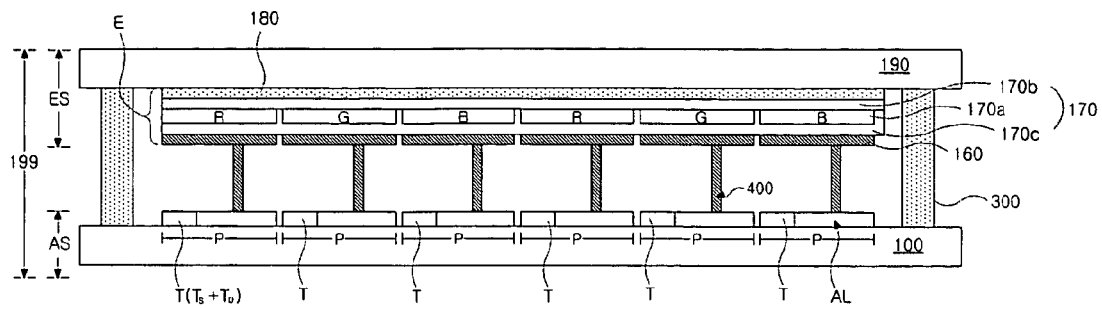
FIG. 3 is a schematic cross-sectional view showing an organic electroluminescent device according to a first exemplary embodiment of the present invention.

FIG. 3 is a schematic cross-sectional view showing an organic electroluminescent device according to a first exemplary embodiment of the present invention.

In FIG. 3, an organic electroluminescent (EL) device 199 includes an array substrate "AS" having a thin film transistor (TFT) "T" and an array layer "AL" and an electroluminescent substrate "ES" having an organic electroluminescent (EL) diode "E." The array substrate "AS" having a plurality of pixel regions "P" and the electroluminescent substrate "ES" having a plurality of corresponding pixel regions are attached by using a sealant 300. A switching element "$T_S$" and a driving element "$T_D$" are formed on a first substrate 100 in each pixel region "P."

A first electrode 180 is disposed on a second substrate 190 and an organic luminescent layer 170 is disposed on the first electrode 180. The organic luminescent layer 170 is formed of a plurality of sub-layers. The organic luminescent layer 170 may include a hole injection layer (HIL) 170b on the first electrode 180, an emitting material layer (EML) 170a on the HIL 170b and an electron injection layer (EIL) 170c on the EML 170a. The HIL 170b and the EIL 170c may be used to inject holes and electrons, respectively. The organic luminescent layer 170 emits light of red, green, and blue colors in which each color is alternately disposed within each pixel region "P." Even though not shown in FIG. 3, a hole transporting layer (HTL) may be further disposed between the HIL 170b and the EML 170a and an electron transporting layer (ETL) may be further disposed between the EML 170a and the EIL 170c. A second electrode 160 is disposed on the organic luminescent layer 170 in each pixel region "P." The first electrode 180, the second electrode 160 and the organic luminescent layer 170 constitute the organic EL diode "E."

The second electrode 160 of the electroluminescent substrate "ES" may be connected to the driving element "$T_D$" of the array substrate "AS" through a connection electrode 400. The connection electrode 400 has a height matching to a space between the array substrate "AS" and the electroluminescent substrate "ES." In addition, the driving element "$T_D$" includes a plurality of negative type (N-type) polycrystalline silicon thin film transistors (p-Si TFTs) and the switching element "$T_S$" includes a positive type (P-type) polycrystalline silicon thin film transistor (p-Si TFT).

Figure 4:
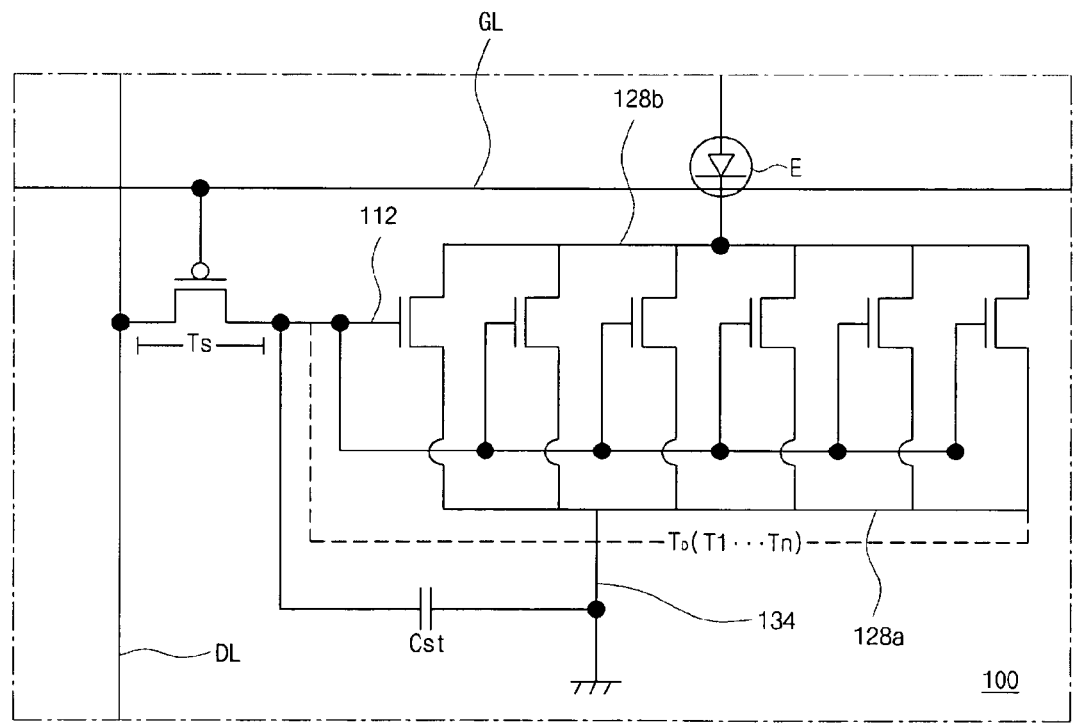
FIG. 4 is an equivalent circuit diagram showing a single pixel region of an organic electroluminescent device according to the first exemplary embodiment of the present invention.

FIG. 4 is an equivalent circuit diagram showing a single pixel region of an organic electroluminescent device according to the first exemplary embodiment of the present invention.

In FIG. 4, a P-type p-Si TFT is used as a switching element "Ts" and a plurality of N-type p-Si TFTs "$T_1$" to "$T_n$" are used as a driving element "$T_D$." The plurality of N-type p-Si TFTs "$T_1$" to "$T_n$" are connected to an organic EL diode "E" in parallel. The switching element "$T_S$" is connected to a gate line "GL" and a data line "DL," and the driving element "$T_D$" is connected to the switching element "$T_S$." The driving element "$T_D$" includes a driving gate electrode 112, a driving source electrode 128a, and a driving drain electrode 128b. The driving gate electrode 112 is connected to the switching element "$T_S$." In addition, the driving source electrode 128a is connected to a ground line 134 and the driving drain electrode 128b is connected to the organic EL diode "E." A storage capacitor "$C_{ST}$" is connected to the driving gate electrode 112 and the driving source electrode 128a.

Since a P-type p-Si TFT is used as the switching element "$T_S$," a leakage current is reduced while the switching element "Ts" is turned off. A P-type p-Si TFT has a higher operation speed and a lower leakage current than an N-type amorphous silicon (a-Si) TFT. Accordingly, the switching element "$T_S$" using a P-type p-Si TFT is operated in more stable manner. Moreover, since a plurality of N-type p-Si TFTs are used as the driving element "$T_D$," a deterioration of the driving element "$T_D$" due to a stress resulting from an increased current density is prevented. When the driving element "$T_D$" is turned on, a current having an increased current density flows through the driving element "$T_D$" and the stress caused by the increased current density may deteriorate the driving element "$T_D$." In the first exemplary embodiment, the current having an increased current density and a stress resulting from such increased current density are distributed to the plurality of N-type p-Si TFTs. Accordingly, the deterioration of the driving element "$T_D$" is prevented and lifetime of the driving element "$T_D$" is improved.

Figure 5:
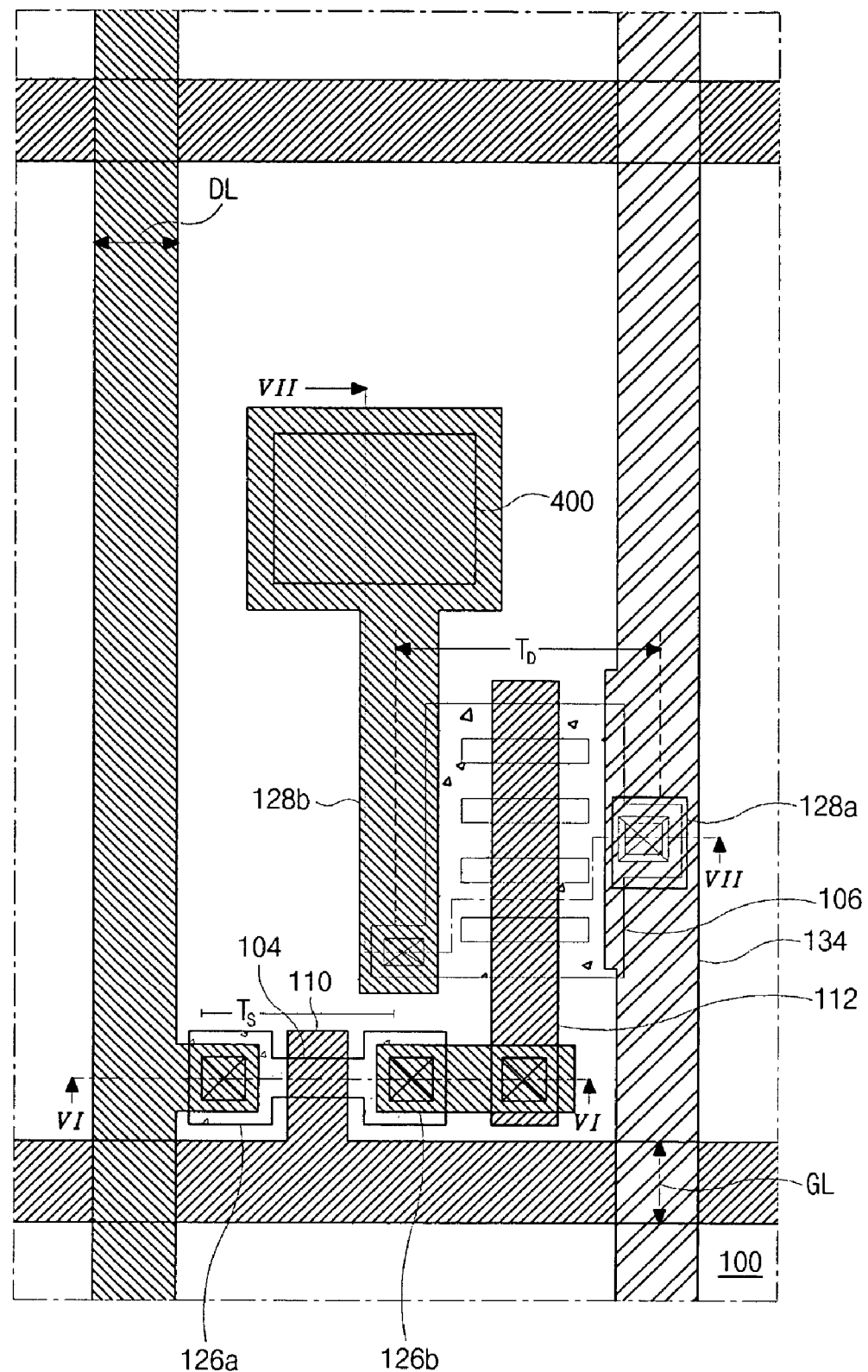
FIG. 5 is a schematic plane view showing an array substrate for an organic electroluminescent device according to the first exemplary embodiment of the present invention.

FIG. 5 is a schematic plane view showing an array substrate for an organic electroluminescent device according to the first exemplary embodiment of the present invention. For simplicity, a storage capacitor is not shown in FIG. 5.

In FIG. 5, a gate line "GL" and a data line "DL" are disposed on a substrate 100. The gate line "GL" intersects the data line "DL" to define a pixel region "P." A switching element "$T_S$" is connected to the gate line "GL" and the data line "DL." And, a driving element "$T_D$" is connected to the switching element "$T_S$." The switching element "$T_S$" includes a switching active layer 104, a switching gate electrode 110, a switching source electrode 126a and a switching drain electrode 126b. The switching active layer 104 includes polycrystalline silicon (p-Si). The switching gate electrode 110 is connected to the gate line "GL" and the switching source electrode 126a is connected to the data line "DL." The switching source electrode 126a and the switching drain electrode 126b are disposed spaced apart from each other and each respectively contacting side portions of the switching active layer 104. The side portions of the switching active layer 104 are doped with P-type impurities such as boron (B) and arsenic (As).

The driving element "$T_D$" includes a driving gate electrode 112, a driving active layer 106, a driving source electrode 128a and a driving drain electrode 128b. The driving gate electrode 112 is connected to the switching drain electrode 126b. The driving active layer 106 includes polycrystalline silicon (p-Si). The driving source electrode 128a and the driving drain electrode 128b are disposed spaced apart from each other and each respectively contacting side portions of the driving active layer 106. The side portions of the driving active layer 106 are doped with N-type impurities such as phosphorus (P). In addition, the driving source electrode 128a is connected to a ground line 134. The driving active layer 106 may have a plurality of openings corresponding to the driving gate electrode 112, since the driving gate electrode 112 crosses the substantially large area of the driving active layer 106. Accordingly, the driving active layer 106 overlapping the driving gate electrode 112 may be divided into a plurality of sub-portions and each sub-portion functions as an active layer for an instant individual N-type p-Si TFT constituting the driving element "$T_D$." As a result, the driving element "$T_D$" includes a plurality of N-type p-Si TFTs connected to the ground line 134 in parallel. Even though not shown in FIG. 5, the driving drain electrode 128b may be connected to an organic electroluminescent (EL) diode "E" (of FIG. 4) of an opposite substrate through a connection electrode 400 on the driving drain electrode 128b.

FIGS. 6A to 6H are schematic cross-sectional views taken along line "VI-VI" of FIG. 5, showing a fabricating process of an array substrate for an organic electroluminescent device according to the first exemplary embodiment of the present invention. FIGS. 7A to 7H are schematic cross-sectional views taken along line "VII-VII" of FIG. 5, showing a fabricating process of an array substrate for an organic electroluminescent device according to the first exemplary embodiment of the present invention.

Figure 6A:
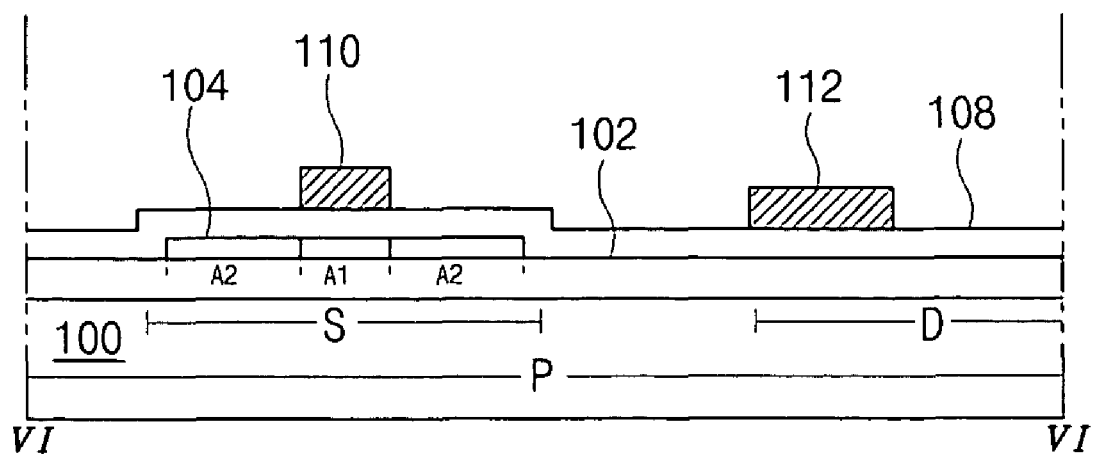
FIGS. 6A to 6H are schematic cross-sectional views taken along line "VI-VI" of FIG. 5, showing a fabricating process of an array substrate for an organic electroluminescent device according to the first exemplary embodiment of the present invention.
Figure 7A:
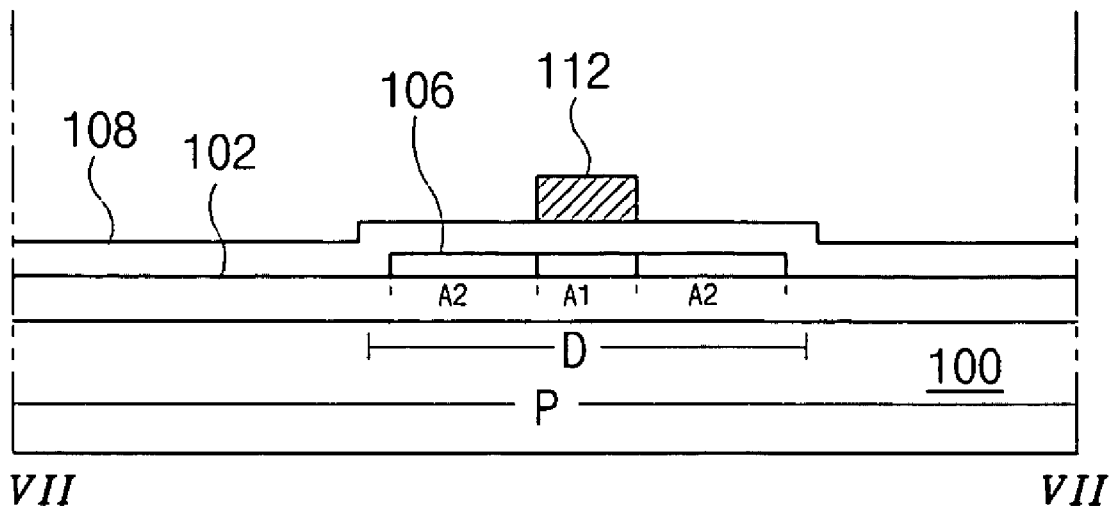
FIGS. 7A to 7H are schematic cross-sectional views taken along line "VII-VII" of FIG. 5, showing a fabricating process of an array substrate for an organic electroluminescent device according to the first exemplary embodiment of the present invention.

In FIGS. 6A and 7A, a pixel region of a substrate 100 includes a switching region "S" and a driving region "D." A buffer layer 102 is disposed on an entire surface of the substrate 100 by depositing an inorganic insulating material such as silicon nitride (SiNx) and silicon oxide ($SiO_2$). Next, a switching active layer 104 and a driving active layer 106 are disposed on the buffer layer 102 in the switching region "S" and the driving region "D," respectively. After an amorphous silicon layer is disposed on the buffer layer 102, the amorphous silicon layer may be crystallized to a polycrystalline silicon layer using either heat or light. Then, the polycrystalline layer may be patterned to be the switching active layer 104 and the driving active layer 106.

Each of the switching active layer 104 and the driving active layer 106 includes a first active portion "A1" and a second active portion "A2." The first active portion "A1" and the second active portion "A2" function as a channel region and an ohmic contact region, respectively. Next, a gate insulating layer 108 is disposed on the switching active layer 104 and the driving active layer 106 by depositing an inorganic insulating material such as silicon nitride (SiNx) and silicon oxide ($SiO_2$). Next, a switching gate electrode 110 is disposed on the gate insulating layer 108 over a portion of the switching active layer 104, and a driving gate electrode 112 is disposed on the gate insulating layer 108 over a portion of the driving active layer 106. The switching gate electrode 110 and the driving gate electrode 112 are formed over the portions corresponding to the first active portions "A1" of the switching active layer 104 and the driving active layer 106, respectively.

The driving active layer 106 includes a plurality of openings corresponding to the driving gate electrode 112 which crosses the substantially large area of the driving active layer 106. Accordingly, portions where the driving active layer 106 overlap the driving gate electrode 112 may be divided into a plurality of sub-portions. Each sub-portion is separated from each other and functions as an active layer for an instant individual N-type p-Si TFT. Therefore, the number of the plurality of sub-layers corresponds to the number of a plurality of N-type p-Si TFTs constituting a driving element "$T_D$" (of FIG. 5). In addition, a portion of the gate line "GL" (of FIG. 5) connected to the switching gate electrode 110 is disposed on the gate insulating layer 108.

Figure 6B:
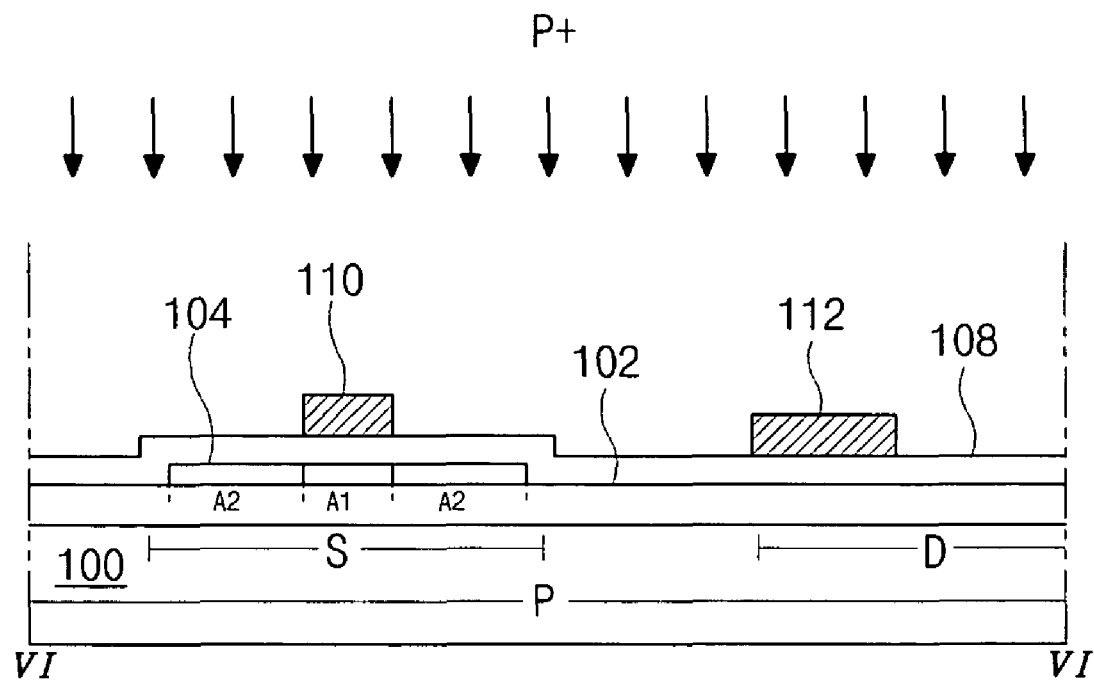
Figure 7B:
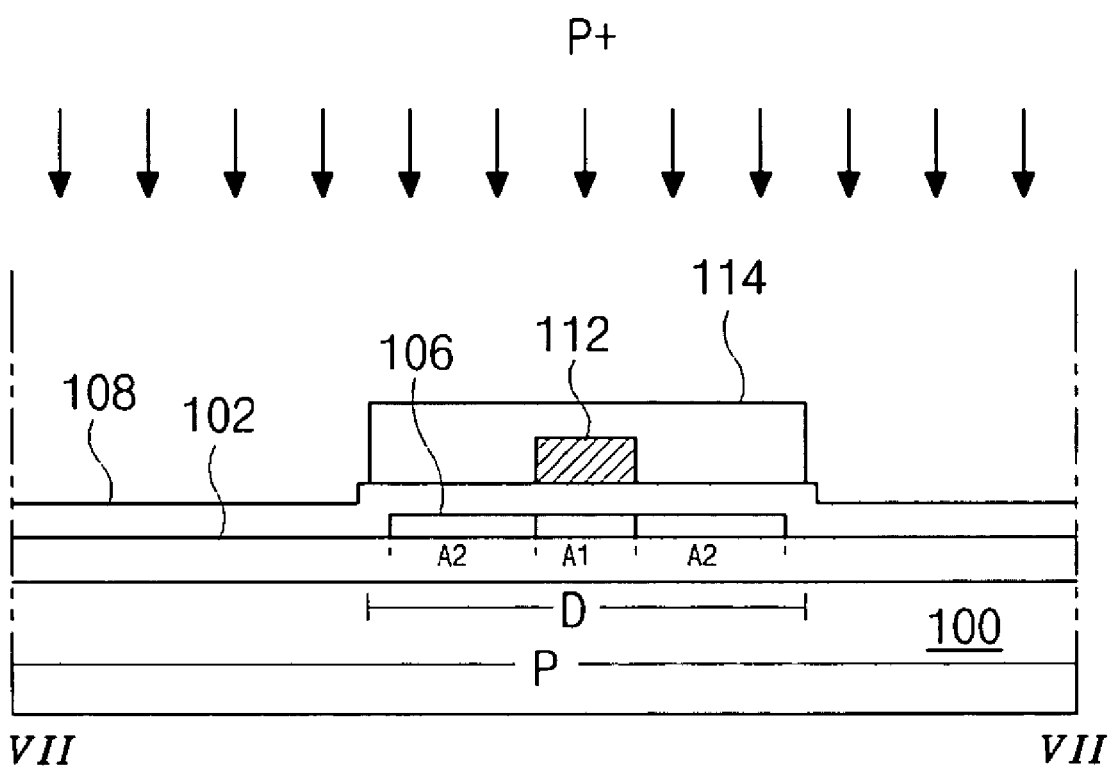

In FIGS. 6B and 7B, after a first photoresist (PR) pattern 114 is disposed covering the driving region "D" including the driving gate electrode 112 and the driving active layer 106, an entire surface of the substrate 100 is doped with P-type impurities such as boron (B) and arsenic (As). Accordingly, the second active portion "A2" of the switching active layer 104 is doped with P-type impurities. However, the second active portion "A2" of the driving active layer 106 is not doped with P-type impurities since it is covered with the first PR pattern 114, and remains as an intrinsic semiconductor layer.

Figure 6C:
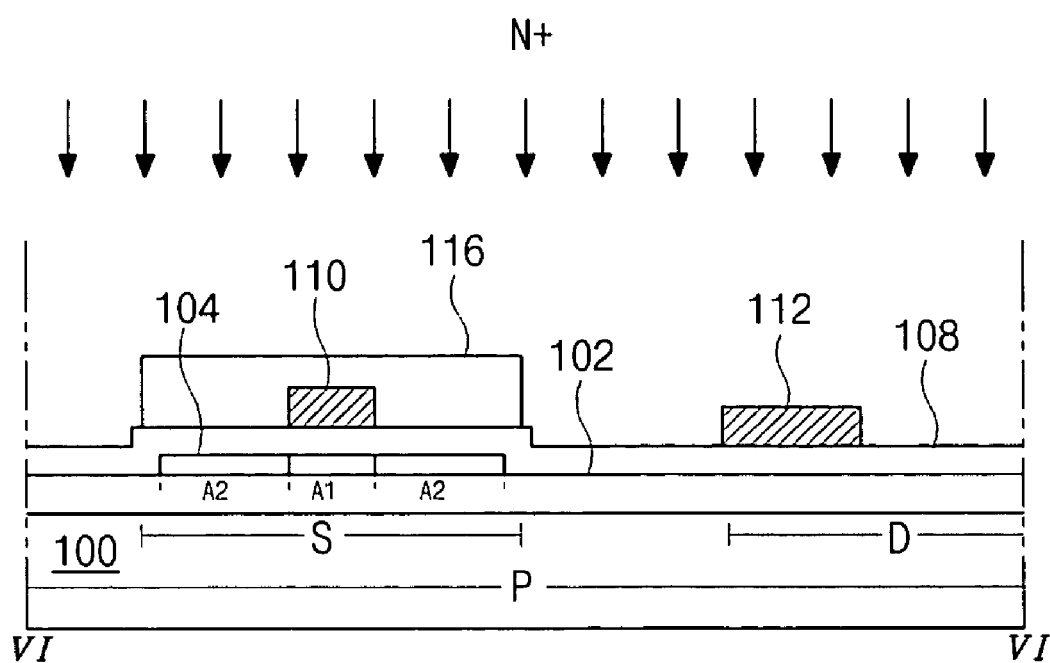
Figure 7C:
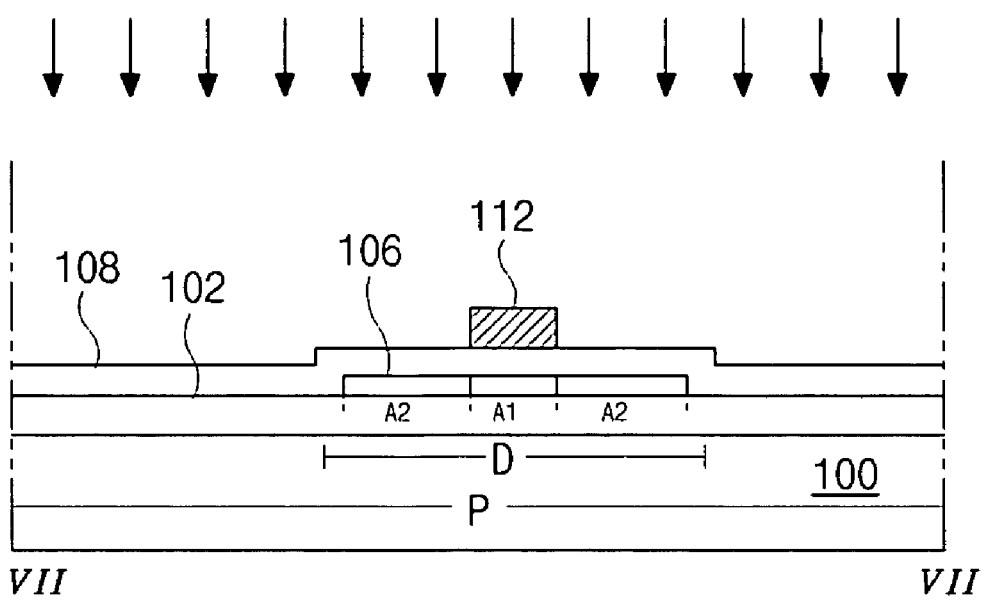

In FIGS. 6C and 7C, after removing the first PR pattern 114, a second PR pattern 116 is disposed covering the switching region "S" including the switching gate electrode 110 and the switching active layer 104. Then, an entire surface of the substrate 100 is doped with N-type impurities such as phosphorus (P). Accordingly, the second active portion "A2" of the driving active layer 106 is doped with N-type impurities. The second active portion "A2" of the switching active layer 104 remains as a P-type impurity-doped semiconductor layer, since it is covered with the second PR pattern 116, and is not doped with the N-type impurities.

Figure 6D:
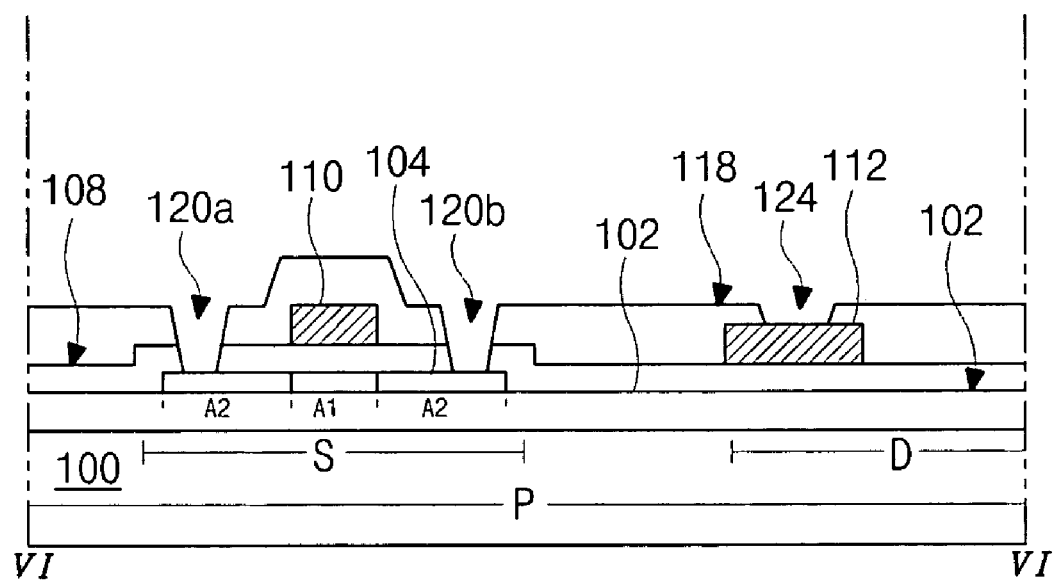
Figure 7D:
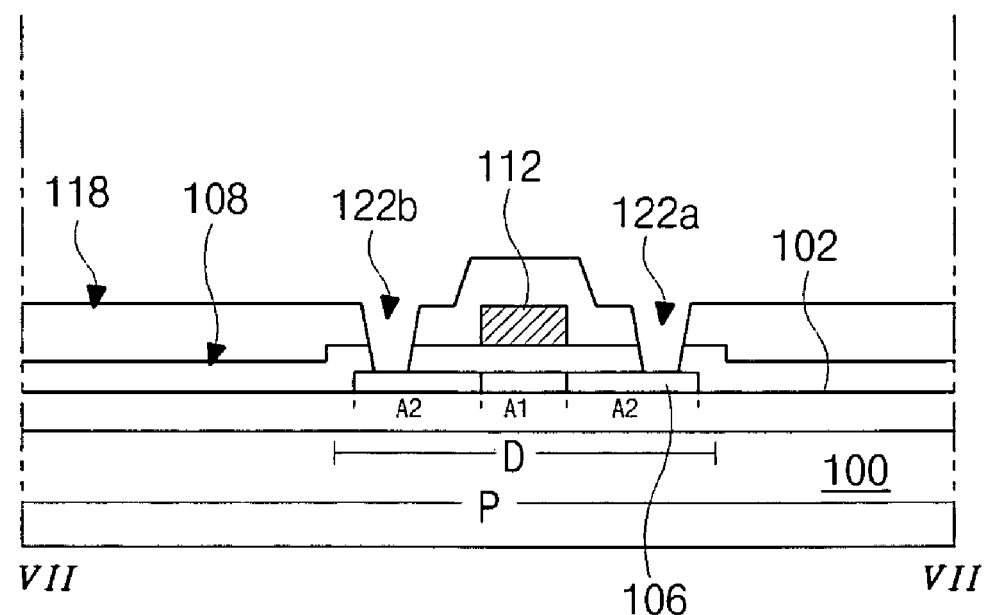

In FIGS. 6D and 7D, after the second PR pattern 116 is removed, an interlayer insulating layer 118 is disposed on the switching gate electrode 110 and the driving gate electrode 112 by depositing an inorganic insulating material such as silicon nitride (SiNx) and silicon oxide ($SiO_2$). A switching source contact hole 120a, a switching drain contact hole 120b, a driving source contact hole 122a and a driving drain contact hole 122b are defined through the interlayer insulating layer 118 by patterning. The switching source contact hole 120a and the switching drain contact hole 120b expose the second active portion "A2" of the switching active layer 104, and the driving source contact hole 122a and the driving drain contact hole 122b expose the second active portion "A2" of the driving active layer 106. At the same time, a gate contact hole 124 exposing the driving gate electrode 112 in the driving region "D" is defined through the interlayer insulating layer 118.

Figure 6E:
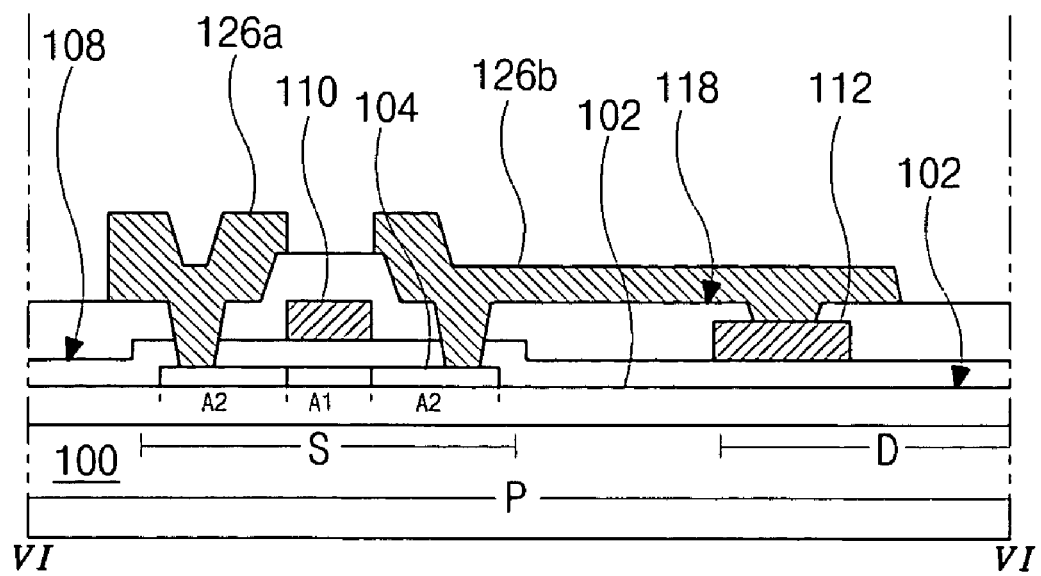
Figure 7E:
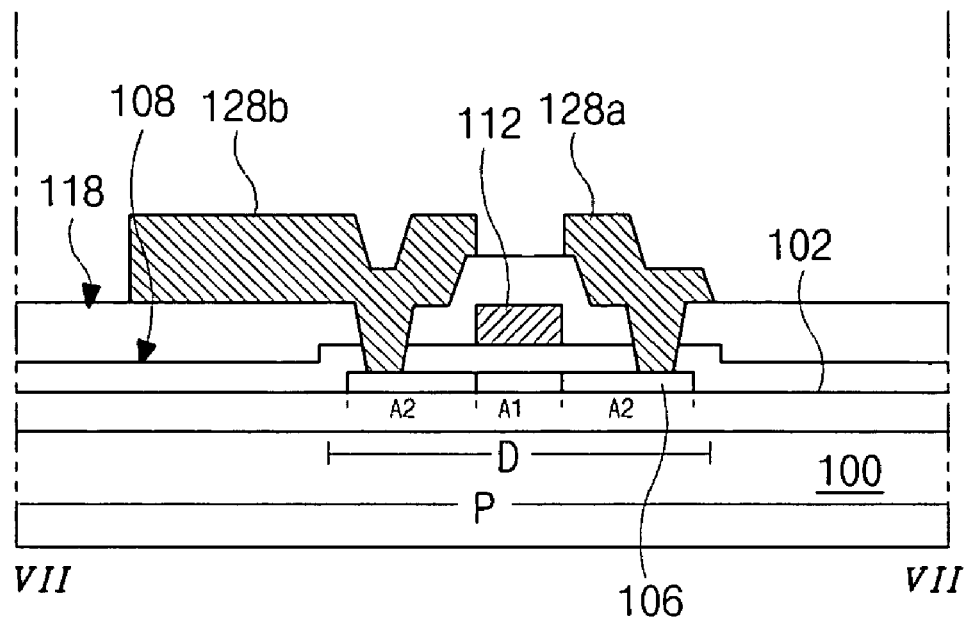

In FIGS. 6E and 7E, a switching source electrode 126a, a switching drain electrode 126b, a driving source electrode 128a and a driving drain electrode 128b are disposed on the interlayer insulating layer 118 by depositing and patterning at least one of a conductive metallic material group including chromium (Cr), molybdenum (Mo), titanium (Ti), aluminum (Al), aluminum alloy, tungsten (W), tantalum (Ta) and molybdenum tungsten alloy (MoW). The switching source electrode 126a and the switching drain electrode 126b are connected to the second active portion "A2" of the switching active layer 104 within the switching source contact hole 120a and the switching drain contact hole 120b, respectively. In addition, the driving source electrode 128a and the driving drain electrode 128b are connected to the second active portion "A2" of the driving active layer 106 through the driving contact hole 122a and the driving drain contact hole 122b, respectively. At the same time, a data line "DL" (of FIG. 5) having a portion connected to the switching source electrode 126a in the switching region "S" is disposed on the interlayer insulating layer 118.

Figure 6F:
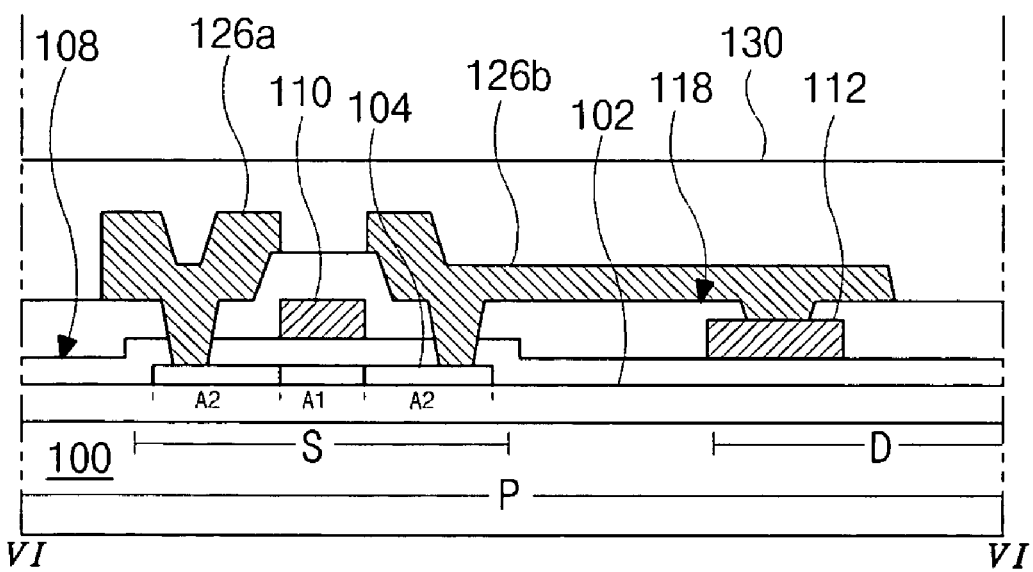
Figure 7F:
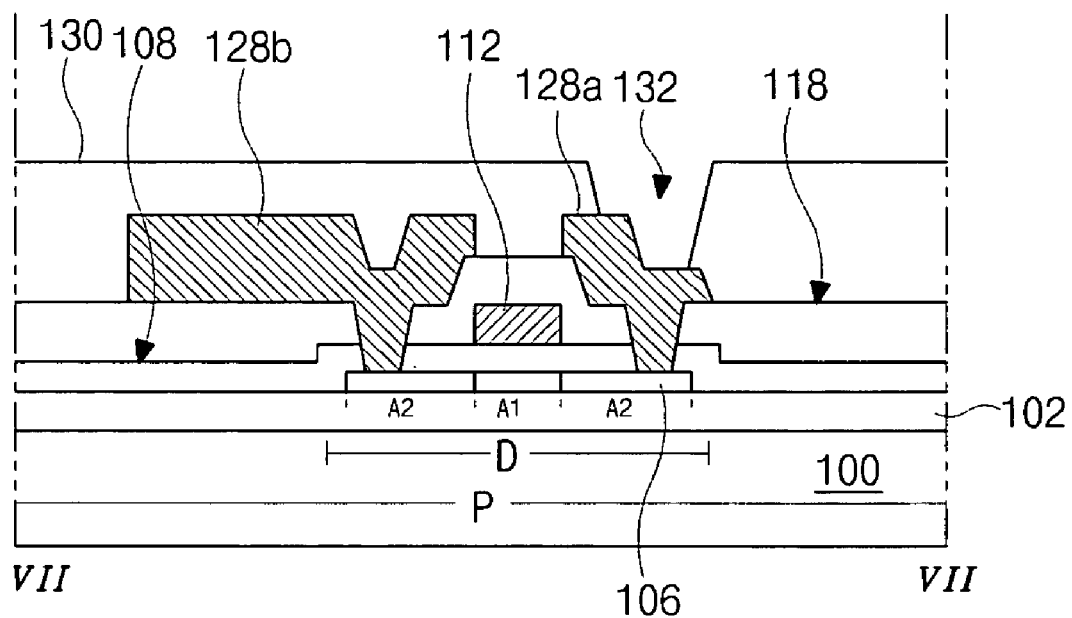

In FIGS. 6F and 7F, a first passivation layer 130 is disposed on the switching source electrode 126a, the switching drain electrode 126b, the driving source electrode 128a and the driving drain electrode 128b by depositing one of an inorganic insulating material such as silicon nitride (SiNx) and silicon oxide (SiO$_2$), and an organic insulating material such as benzocyclobutene (BCB) and acrylic resin. A source contact hole 132 exposing the driving source electrode 128a in the driving region "D" is defined through the first passivation layer 130.

Figure 6G:
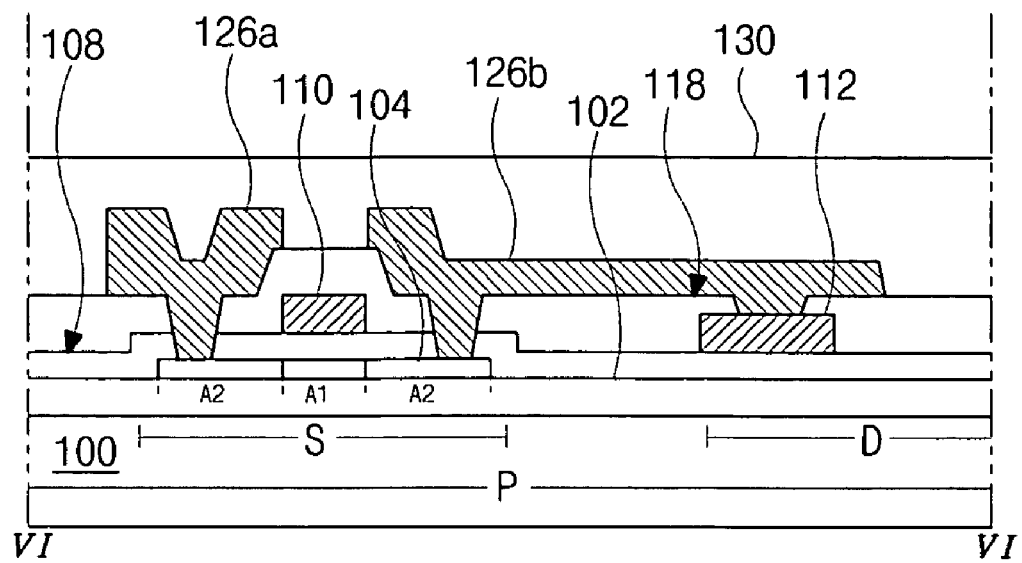
Figure 7G:
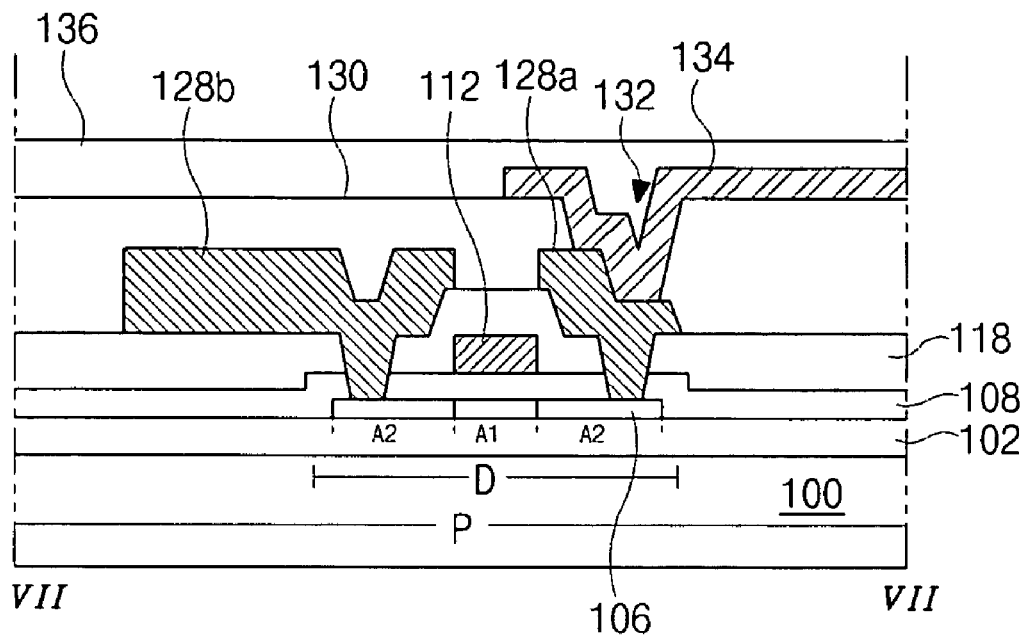

In FIGS. 6G and 7G, a ground line 134 is disposed on the first passivation layer 130 by depositing and patterning at least one of a conductive metallic group material including chromium (Cr), molybdenum (Mo), titanium (Ti), aluminum (Al), aluminum alloy, tungsten (W), tantalum (Ta) and molybdenum tungsten alloy (MoW). The ground line 134 is connected to the driving source electrode 128a in the driving region "D" within the source contact hole 132. The ground line 134 may be simultaneously disposed with the driving gate electrode 112 and then may be connected to the driving source electrode 128a in a subsequent process in another embodiment. In addition, a second passivation layer 136 is disposed on the ground line 134 by depositing one of an inorganic insulating material such as silicon nitride (SiNx) and silicon oxide (SiO$_2$), and an organic insulating material such as benzocyclobutene (BCB) and acrylic resin.

Figure 6H:
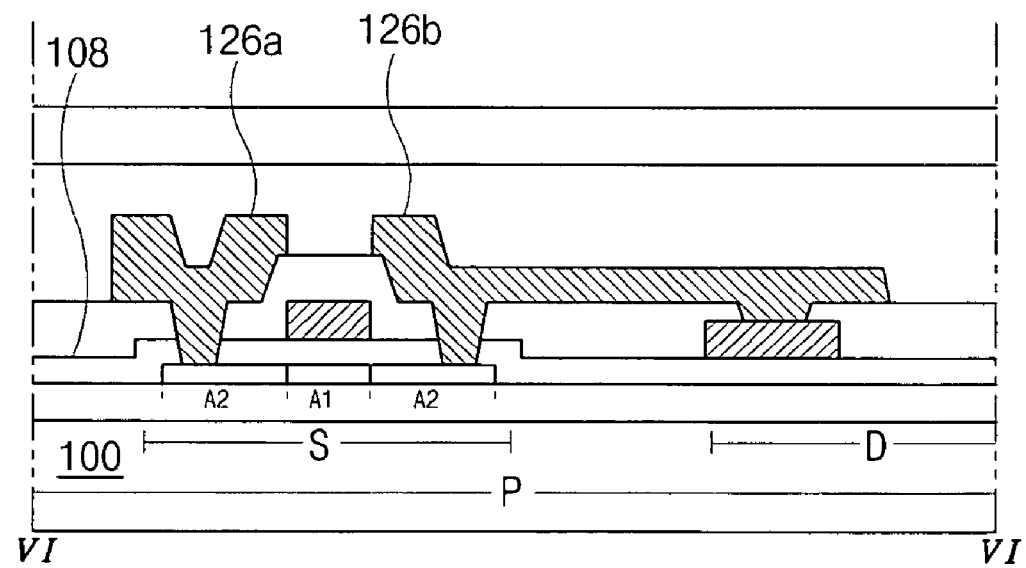
Figure 7H:
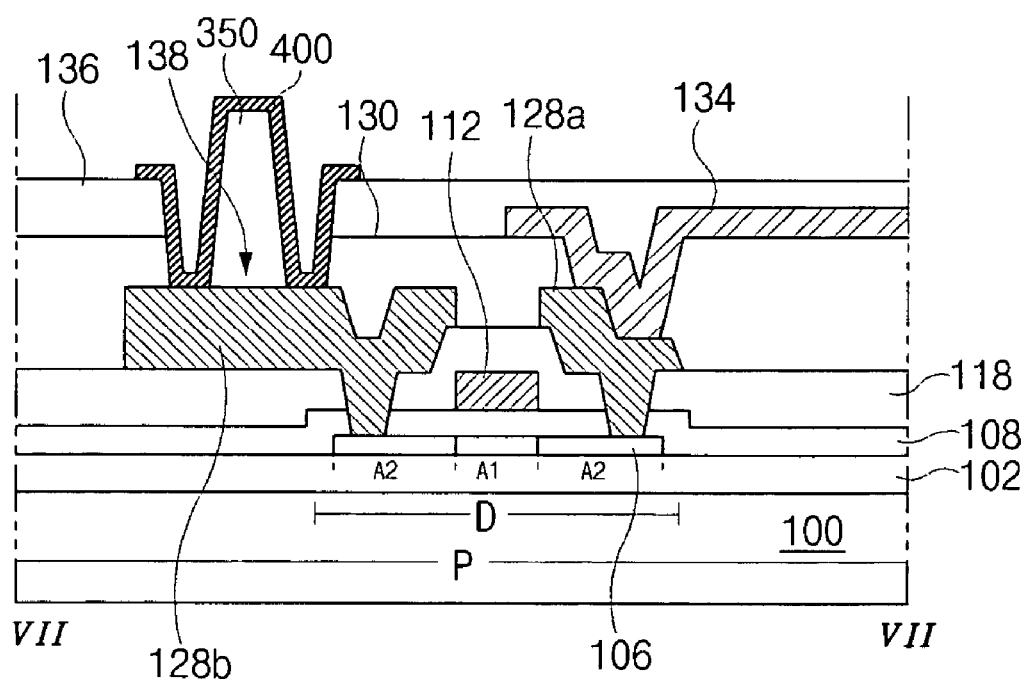

In FIGS. 6H and 7H, a drain contact hole 138 exposing the driving drain electrode 128b in the driving region "D" is defined through the first and second passivation layers 130 and 136. Then, a connection electrode 400 is disposed on the second passivation layer 136 to connect a driving element "T$_D$" (of FIG. 4) and an organic EL diode "E" (of FIG. 4). The connection electrode 400 is connected to the driving drain electrode 128b within the drain contact hole 138. An organic material pattern 350 may be disposed within the drain contact hole 138. Thereafter, the connection electrode 400 may be disposed on the organic material pattern 350. A portion of the organic material pattern 350 having the connection electrode 400 disposed thereon, may protrude from the drain contact hole 138 to help connect the connection electrode 400 and a second electrode 160 (of FIG. 3) of the organic EL diode "E" (of FIG. 3). Accordingly, the organic material pattern 350 may have a height matching to a space formed between the array substrate "AS" (of FIG. 3) and the electroluminescent substrate "ES" (of FIG. 3).

An array substrate "AS" (of FIG. 3) fabricated through a process shown in FIGS. 6A to 6H and 7A to 7H may be attached to an electroluminescent substrate "ES" (of FIG. 3), thereby completing a dual plate type organic EL device according to the first exemplary embodiment of the present invention. In the organic EL device according to the first exemplary embodiment of the present invention, a P-type p-Si TFT is used as a switching element and a plurality of N-type p-Si TFTs are used as a driving element. Since a P-type p-Si TFT has a higher operation speed and a lower leakage current than an N-type a-Si TFT, characteristics of a switching element are improved. However, since an additional doping process for P-type impurities is required, a fabrication process becomes increasingly complicated and fabrication cost increases. To improve the above disadvantages, a second exemplary embodiment of the present invention is suggested.

Figure 8:
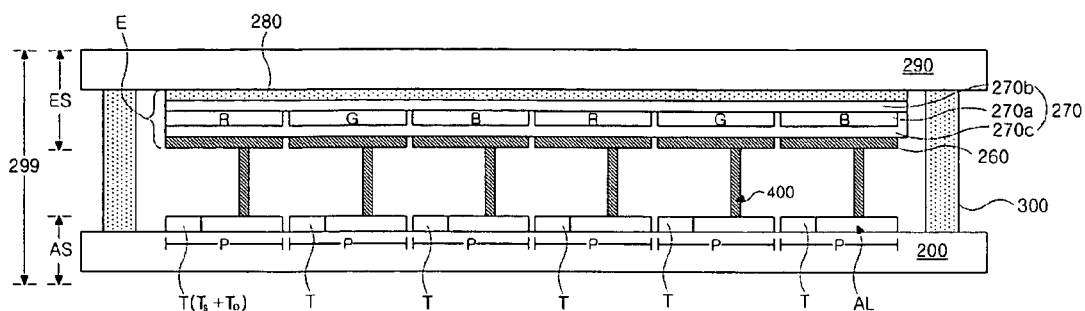
FIG. 8 is a schematic cross-sectional view showing an organic electroluminescent device according to a second exemplary embodiment of the present invention.

FIG. 8 is a schematic cross-sectional view showing an organic electroluminescent device according to the second exemplary embodiment of the present invention.

In FIG. 8, an organic electroluminescent (EL) device 299 includes an array substrate "AS" having a thin film transistor (TFT) "T" and an array layer "AL", and an electroluminescent substrate "ES" having an organic electroluminescent (EL) diode "E." The array substrate "AS" having a plurality of pixel regions "P" and the electroluminescent substrate "ES" having a corresponding plurality of pixel regions "P" are attached using a sealant 300. A switching element "T$_S$" and a driving element "T$_D$" are disposed on a first substrate 200 in each pixel region "P."

A first electrode 280 is disposed on a second substrate 290 and an organic luminescent layer 270 is disposed on the first electrode 280. The organic luminescent layer 270 is formed of a plurality of sub-layers. The organic luminescent layer 270 may include a hole injection layer (HIL) 270b on the first electrode 280, an emitting material layer (EML) 270a on the HIL 270b and an electron injection layer (EIL) 270c on the EML 270a. The HIL 270b and the EIL 270c may be used for injecting holes and electrons, respectively. The organic luminescent layer 270 emits light of red, green, and blue colors, where each color is alternately disposed within each pixel region "P". Even though not shown in FIG. 8, a hole transporting layer (HTL) may be further disposed between the HIL 270b and the EML 270a, and an electron transporting layer (ETL) may be further disposed between the EML 270a and the EIL 270c. A second electrode 260 is disposed on the organic luminescent layer 270 corresponding to each pixel region "P." The first electrode 280, the second electrode 260 and the organic luminescent layer 270 constitute the organic EL diode "E."

The second electrode 260 of the electroluminescent substrate "ES" may be connected to the driving element "T$_D$" of the array substrate "AS" through a connection electrode 400. The connection electrode 400 has a height that matches with a space formed between the array substrate "AS" and the electroluminescent substrate "ES." In addition, the switching element "T$_S$" includes a plurality of switching negative type (N-type) polycrystalline silicon (p-Si) thin film transistors (TFTs) and the driving element "T$_D$" includes a plurality of driving negative type (N-type) polycrystalline silicon (p-Si) thin film transistors (TFTs).

Figure 9:
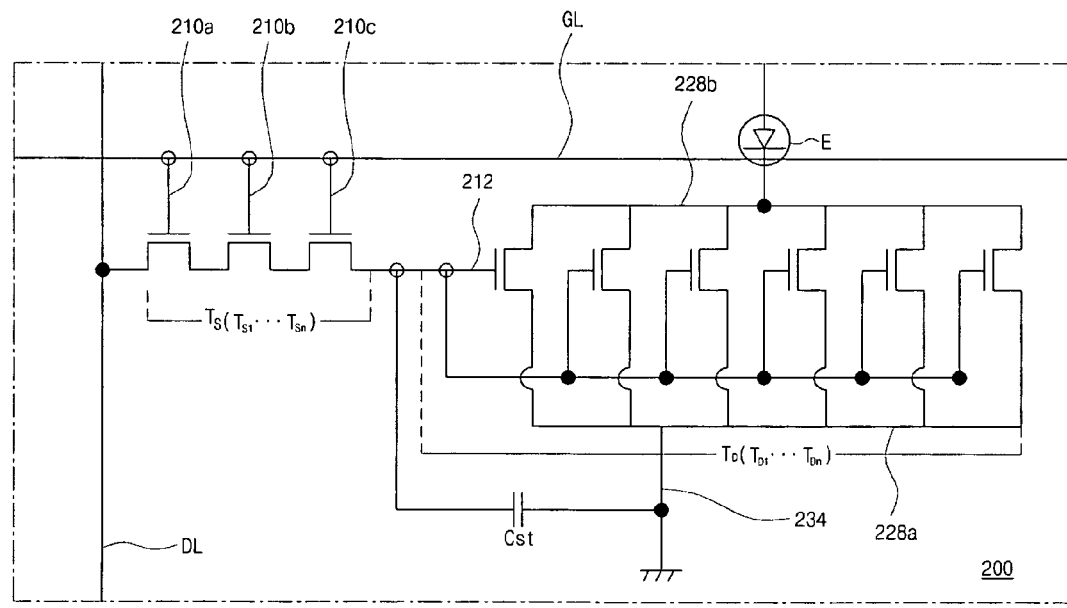
FIG. 9 is an equivalent circuit diagram showing a single pixel region of an organic electroluminescent device according to the second exemplary embodiment of the present invention.

FIG. 9 is an equivalent circuit diagram showing a single pixel region of an organic electroluminescent device according to the second exemplary embodiment of the present invention.

In FIG. 9, a plurality of switching N-type p-Si TFTs "Ts$_{S1}$" to "T$_{Sn}$" are used as a switching element "T$_S$" and a plurality of driving N-type p-Si TFTs "T$_{D1}$" to "T$_{Dn}$" are used as a driving element "T$_D$." The plurality of switching N-type p-Si TFTs "T$_{S1}$" to "T$_{Sn}$" are connected to a data line "DL" in series, while the plurality of driving N-type p-Si TFTs "T$_{D1}$" to "T$_{Dn}$" are connected to an organic EL diode "E" in parallel. The switching element "T$_S$" is connected to a gate line "GL," and the data line "DL" and the driving element "T$_D$" is connected to the switching element "T$_S$." The switching element "T$_S$" includes a plurality of switching gate electrodes 210a, 210b and 210c connected to the gate line "GL." The driving element "T$_D$" includes a driving gate electrode 212, a driving source electrode 228a, and a driving drain electrode 228b. In addition, the driving gate electrode 212 is connected to the switching element "T$_S$." Furthermore, the driving source electrode 228a is connected to a ground line 234, and the driving drain electrode 228b is connected to the organic EL diode "E." A storage capacitor "C$_{ST}$" is connected to the driving gate electrode 212 and the driving source electrode 228a.

Since a plurality of switching N-type p-Si TFTs are used as the switching element "T$_S$," a leakage current is reduced while the switching element "T$_S$" is turned off. In addition, the plurality of switching N-type p-Si TFTs may have a lightly doped drain (LDD) structure for reducing a leakage current further. Accordingly, a stable of the switching element "$T_S$" using a plurality of switching N-type p-Si TFTs is achieved. Moreover, since a plurality of N-type p-Si TFTs are used as the driving element "$T_D$," a deterioration of the driving element "$T_D$" due to a stress resulting from an increased current density is prevented. When the driving element "$T_D$" is turned on, a current having the increased current density flows through the driving element "$T_D$" and a stress caused by such current density may deteriorate the driving element "$T_D$." In the second exemplary embodiment, the current having the increased current density and the stress caused by such current density are distributed to the plurality of N-type p-Si TFTs. Accordingly, the deterioration of the driving element "$T_D$" is prevented and lifetime of the driving element "$T_D$" is improved.

Figure 10:
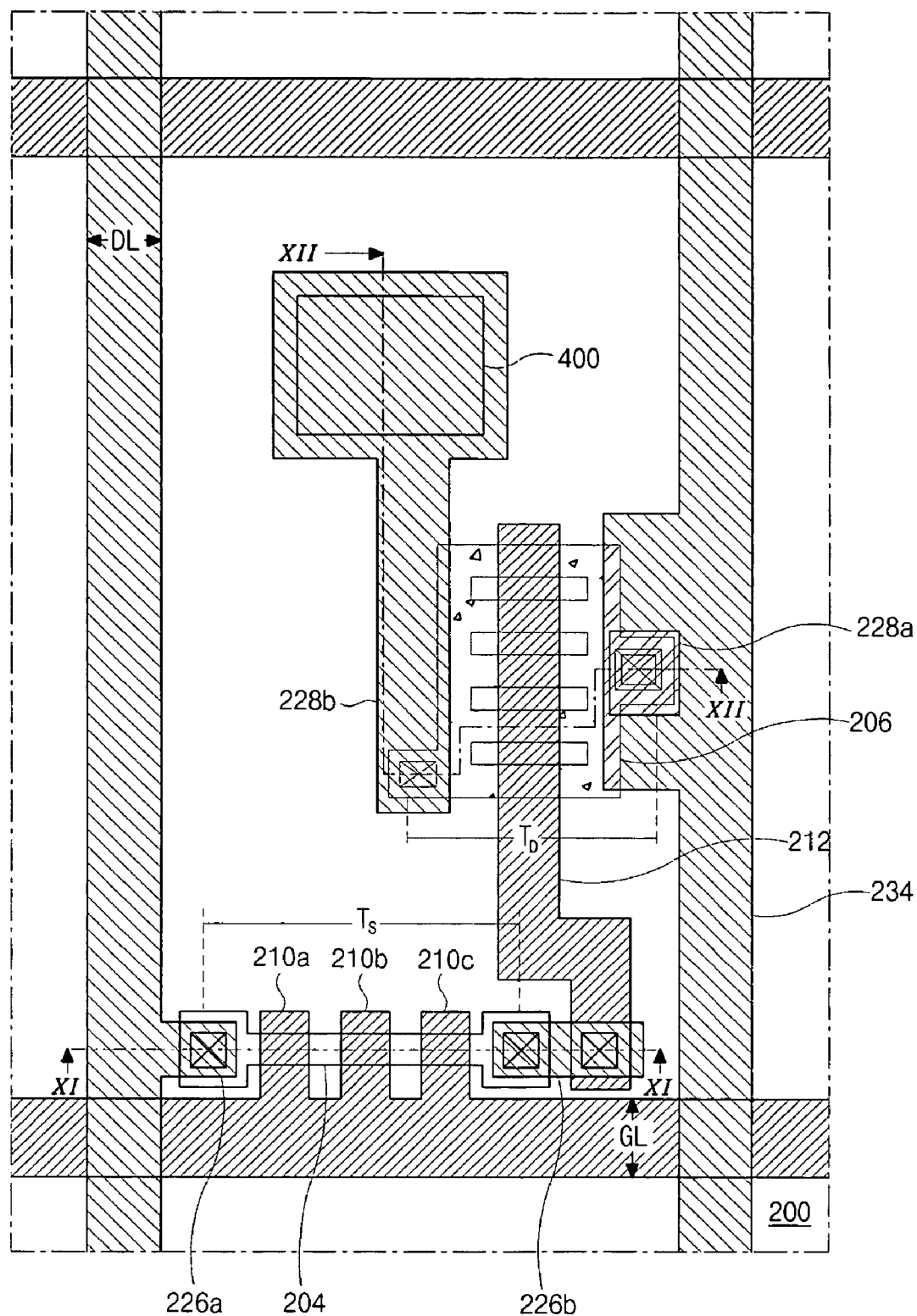
FIG. 10 is a schematic plane view showing an array substrate for an organic electroluminescent device according to the second exemplary embodiment of the present invention.

FIG. 10 is a schematic plane view showing an array substrate for an organic electroluminescent device according to the second exemplary embodiment of the present invention. For simplicity, a storage capacitor is not shown in FIG. 10.

In FIG. 10, a gate line "GL" and a data line "DL" are disposed on a substrate 200. The gate line "GL" intersects the data line "DL" to define a pixel region "P." A switching element "$T_S$" is connected to the gate line "GL" and the data line "DL," and a driving element "$T_D$" is connected to the switching element "$T_S$." The switching element "$T_S$" includes a switching active layer 204, a plurality of switching gate electrodes 210a, 210b and 210c, a switching source electrode 226a and a switching drain electrode 226b. The switching active layer 204 includes polycrystalline silicon (p-Si). The plurality of switching gate electrodes 210a, 210b and 210c are connected to the gate line "GL" and the switching source electrode 226a is connected to the data line "DL." The switching source electrode 226a and the switching drain electrode 226b are disposed spaced apart from each other and each respectively connecting side portions of the switching active layer 204. The side portions of the switching active layer 204 are doped with N-type impurities such as phosphorus (P). Each gate electrode 210a, 210b and 210c functions as a gate electrode for an instant individual switching N-type p-Si TFT constituting the switching element "$T_S$." As a result, the switching element "$T_S$" includes a plurality of switching N-type p-Si TFTs connected to the data line "DL" in series.

The driving element "$T_D$" includes a driving gate electrode 212, a driving active layer 206, a driving source electrode 228a, and a driving drain electrode 228b. The driving gate electrode 212 is connected to the switching drain electrode 226b. The driving active layer 206 includes polycrystalline silicon (p-Si). The driving source electrode 228a and the driving drain electrode 228b are disposed spaced apart from each other and each respectively connecting side portions of the driving active layer 206. The side portions of the driving active layer 206 are doped with N-type impurities such as phosphorus (P). In addition, the driving source electrode 228a is connected to a ground line 234. The driving active layer 206 may have a plurality of openings corresponding to the driving gate electrode 212, which crosses the substantially large area of driving gate electrode 212. Accordingly, the driving active layer 206 overlapping the driving gate electrode 212 may be divided into a plurality of sub-portions and each sub-portion functions as an active layer for an instant individual driving N-type p-Si TFT constituting the driving element "$T_D$." As a result, the driving element "$T_D$" includes a plurality of driving N-type p-Si TFTs connected to the ground line 234 in parallel. Even though not shown in FIG. 10, the driving drain electrode 228b may be connected to an organic electroluminescent (EL) diode "E" (of FIG. 9) of a second substrate through a connection electrode 400 connected to the driving drain electrode 228b.

FIGS. 11A to 11H are schematic cross-sectional views taken along line "XI-XI" of FIG. 10, showing a fabricating process of an array substrate for an organic electroluminescent device according to the second exemplary embodiment of the present invention. FIGS. 12A to 12H are schematic cross-sectional views taken along line "XII-XII" of FIG. 10, showing a fabricating process of an array substrate for an organic electroluminescent device according to the second exemplary embodiment of the present invention.

Figure 11A:
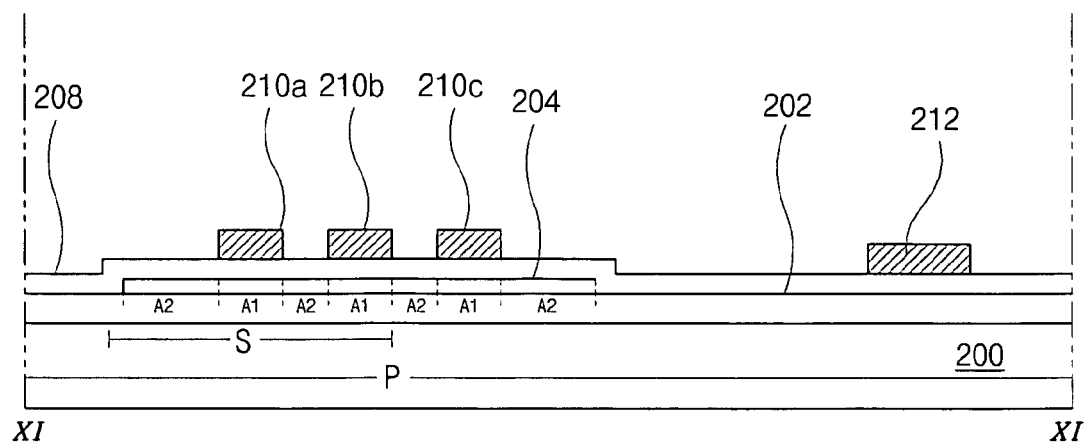
FIGS. 11A to 11H are schematic cross-sectional views taken along line "XI-XI" of FIG. 10, showing a fabricating process of an array substrate for an organic electroluminescent device according to the second exemplary embodiment of the present invention.
Figure 12A:
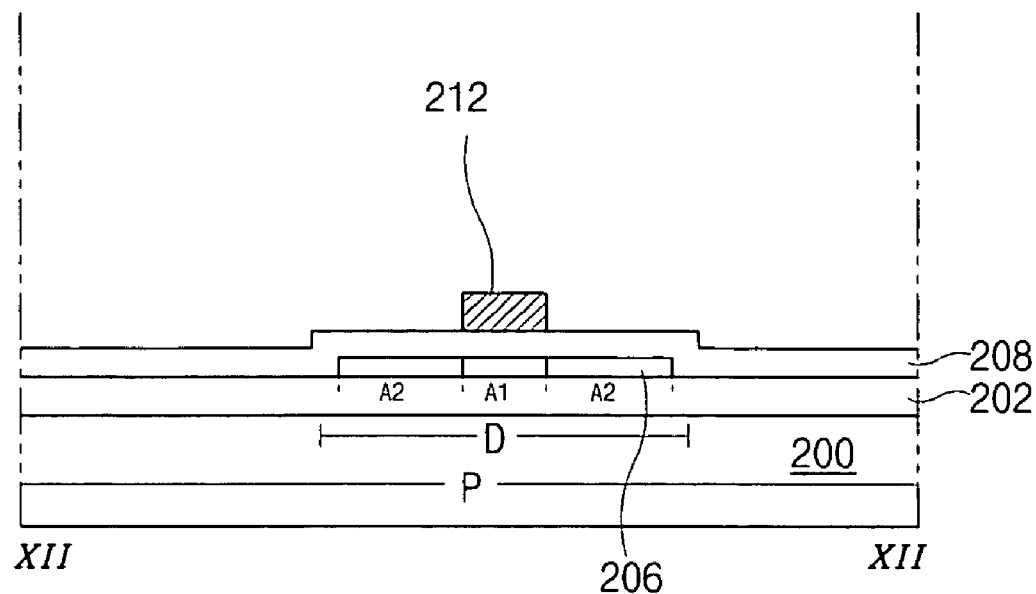
FIGS. 12A to 12H are schematic cross-sectional views taken along line "XII-XII" of FIG. 10, showing a fabricating process of an array substrate for an organic electroluminescent device according to the second exemplary embodiment of the present invention.

In FIGS. 11A and 12A, a pixel region of a substrate 200 includes a switching region "S" and a driving region "D." A buffer layer 202 is disposed on an entire surface of the substrate 200 by depositing an inorganic insulating material such as silicon nitride (SiNx) and silicon oxide ($SiO_2$). Next, a switching active layer 204 and a driving active layer 206 are disposed on the buffer layer 202 in the switching region "S" and the driving region "D," respectively. After an amorphous silicon layer is disposed on the buffer layer 202, the amorphous silicon layer may be crystallized to a polycrystalline silicon layer using heat or light. Then, the polycrystalline layer may be patterned to be the switching active layer 204 and the driving active layer 206.

Each of the switching active layer 204 and the driving active layer 206 includes a first active portion "A1" and a second active portion "A2." The first active portion "A1" and the second active portion "A2" function as a channel region and an ohmic contact region, respectively. Next, a gate insulating layer 208 is disposed on the switching active layer 204 and the driving active layer 206 by depositing an inorganic insulating material such as silicon nitride (SiNx) and silicon oxide ($SiO_2$). Next, a plurality of switching gate electrodes 210a, 210b and 210c are disposed on the gate insulating layer 208 within a portion of the switching active layer 204. A driving gate electrode 212 is disposed on the gate insulating layer 208 within a portion of the driving active layer 206. The plurality of switching gate electrodes 210a, 210b and 210c and the driving gate electrode 212 correspond to the first active portions "A1" of the switching active layer 204 and the driving active layer 206, respectively. Even though not shown in FIG. 11A, all the plurality of gate electrodes 210a, 210b and 210c are connected to a gate line "GL." Since each switching gate electrode 210a, 210b and 210c functions as a gate electrode for an instant individual switching N-type p-Si TFT, the number of the plurality of switching gate electrodes corresponds to the number of a plurality of switching N-type p-Si TFTs constituting a switching element "$T_S$" (of FIG. 10).

The driving active layer 206 includes a plurality of openings corresponding to the driving gate electrode 212, which crosses the substantially large areas of the driving gate electrode 212. Accordingly, a portion of the driving active layer 206 overlapping the driving gate electrode 212 may be divided into a plurality of sub-portions. Each sub-portion is separated from each other and functions as an active layer for an instant individual driving N-type p-Si TFT. Therefore, the number of the plurality of sub-layers corresponds to the number of a plurality of driving N-type p-Si TFTs constituting a driving element "$T_D$" (of FIG. 10). In addition, a portion of a gate line "GL" (of FIG. 10) connected to the plurality of switching gate electrodes 210a, 210b and 210c is disposed on the gate insulating layer 208.

Figure 11B:
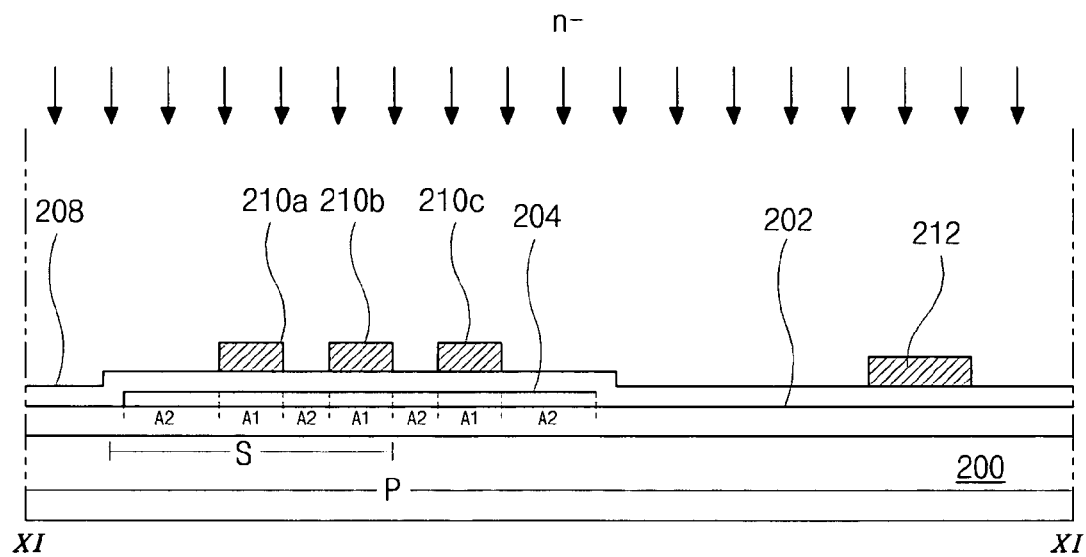
Figure 12B:
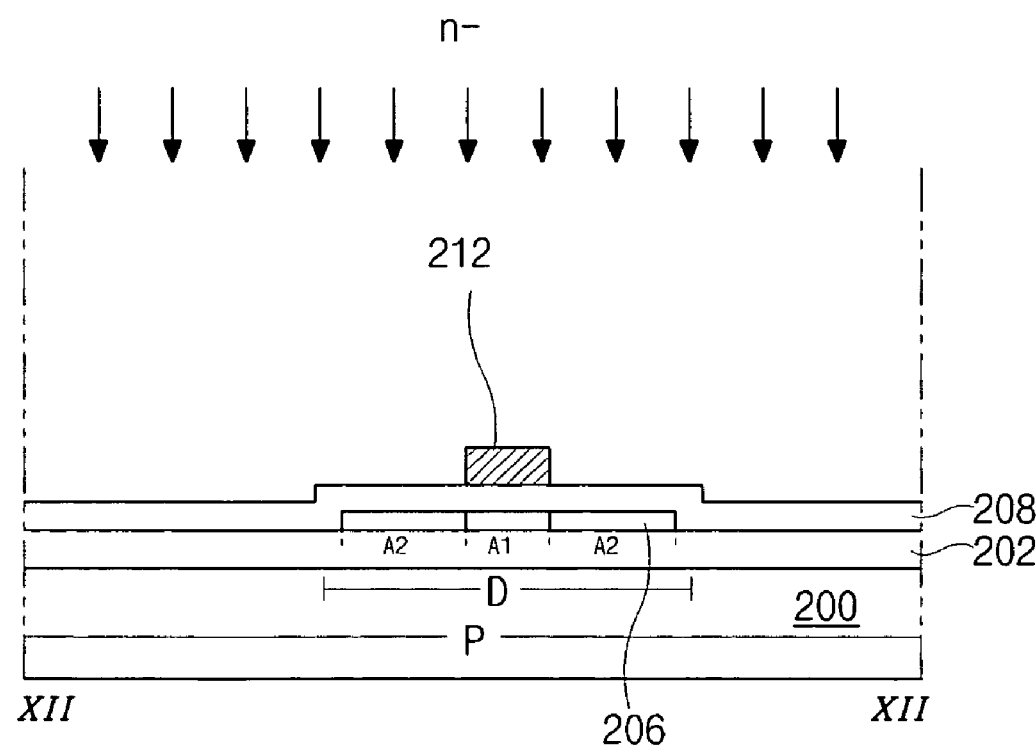

In FIGS. 11B and 12B, an entire surface of the substrate 200 is doped with N-type impurities such as phosphorus (P) having a low dose (n−) to form a lightly doped drain (LDD) region. For example, the low dose may have a concentration of several $10^{12}$ cm$^{-2}$. Since the plurality of switching gate electrodes 210a, 210b and 210c and the driving gate electrode 212 act like a mask blocking the N-type impurities, the first active portions "A1" of the switching active layer 204 and the driving active layer 206 are not doped. The second active portions "A2" of the switching active layer 204 and the driving active layer 206 are doped with the N-type impurities. Accordingly, the second active portions "A2" of the switching active layer 204 and the driving active layer 206 become a low dose N-type (n−) impurity-doped semiconductor layer. In another embodiment, the process of doping with a low dose may be omitted.

Figure 11C:
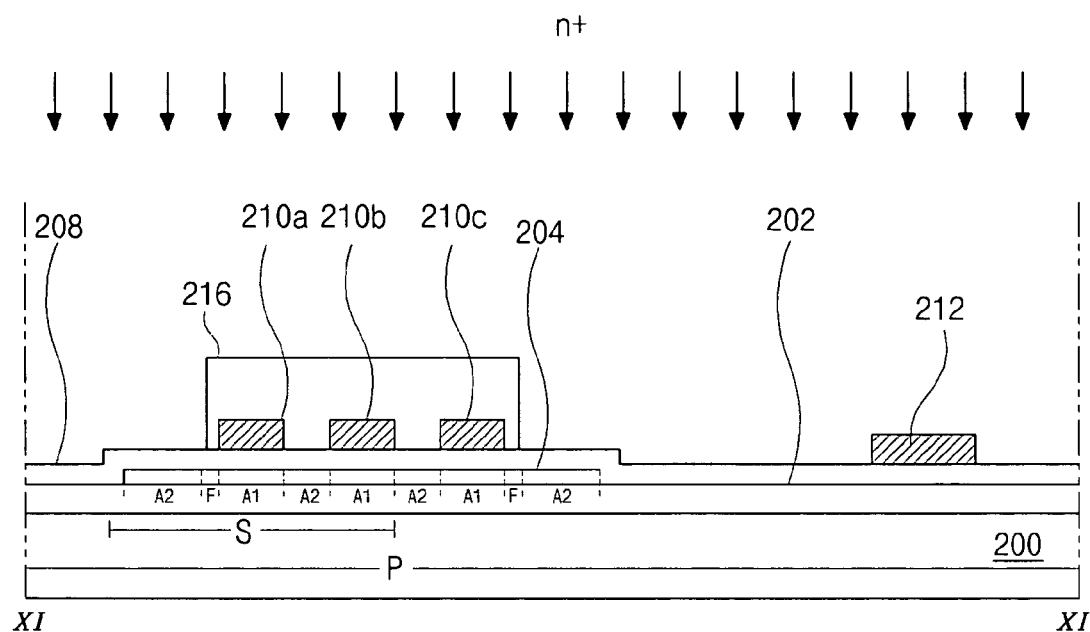
Figure 12C:
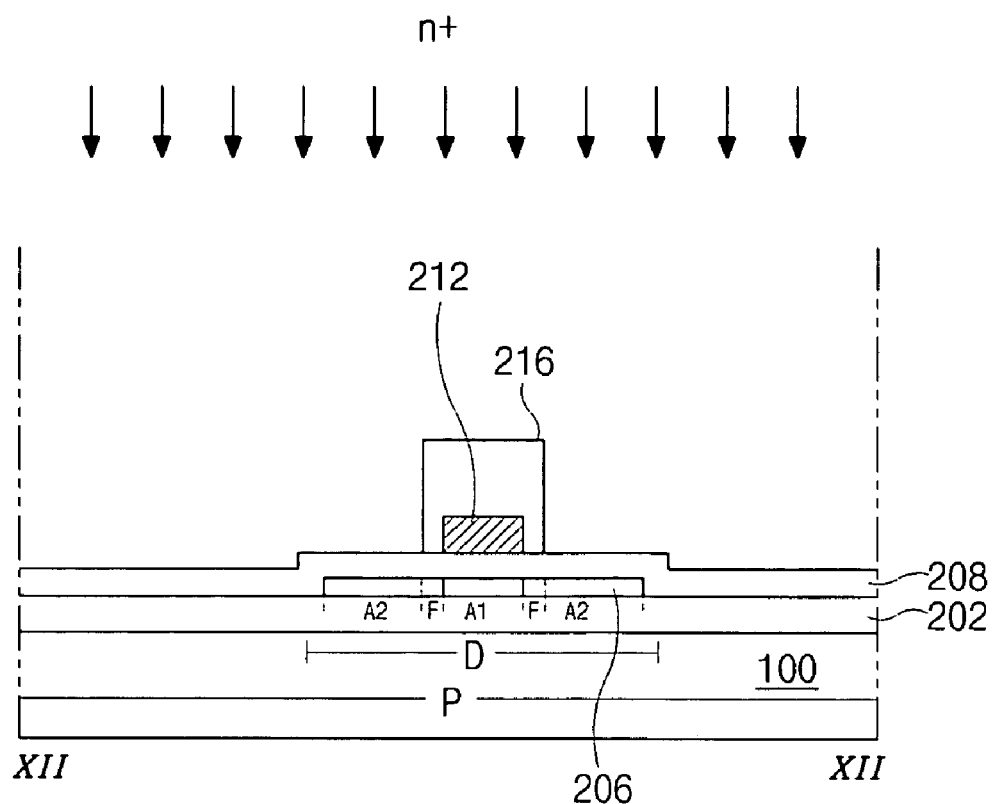

In FIGS. 11C and 12C, after doping with a low dose N-type impurities, a photoresist (PR) pattern 216 is disposed on the plurality of switching gate electrodes 210a, 210b and 210c and the driving gate electrode 212. The PR pattern 216 covers the plurality of switching gate electrodes 210a, 210b and 210c and the driving gate electrode 212. In addition, the PR pattern 216 also covers portions labeled as "F" in the second active portions "A2" of the switching active layer 204 in the switching region "S" and the driving active layer 206 in the driving region "D." After forming the PR pattern 216, an entire surface of the substrate 200 is doped with N-type impurities such as phosphorus (P) having a high dose (n+). Accordingly, portions forming the edges of the second portion "A2" of the switching active layer 204 and the driving active layer 206 become a high dose N-type (n+) impurity-doped semiconductor layer. However, since the PR pattern 216 blocks the doping of the N-type impurities, the first active portion "A1" and the portions "F" in the second active portion "A2" of the switching active layer 204 and the driving active layer 206 are not doped with the high dose (n+) N-type impurities. The part "F" of the second active portion "A2" remains as a low dose N-type (n−) impurity-doped semiconductor layer to act as LDD region. Since the LDD region reduces a thermionic effect, a leakage current is reduced when the TFT is turned off.

Figure 11D:
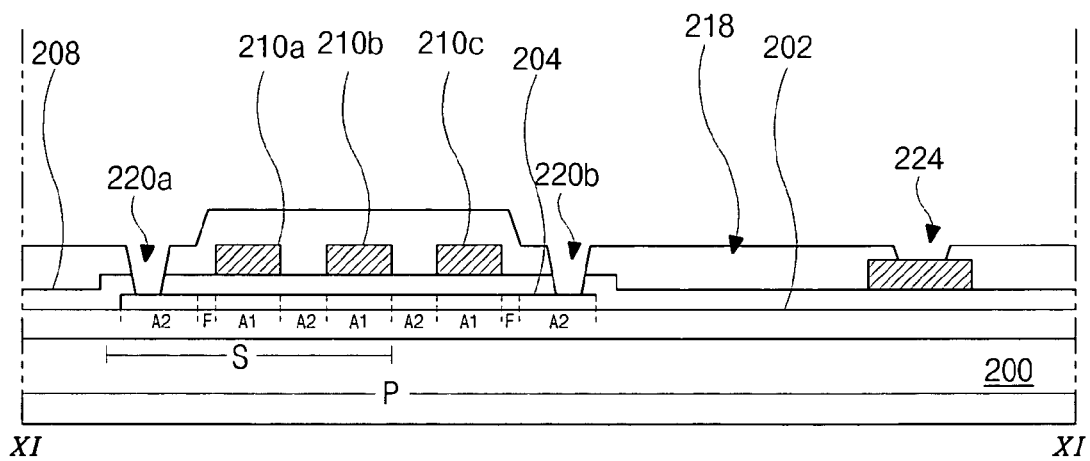
Figure 12D:
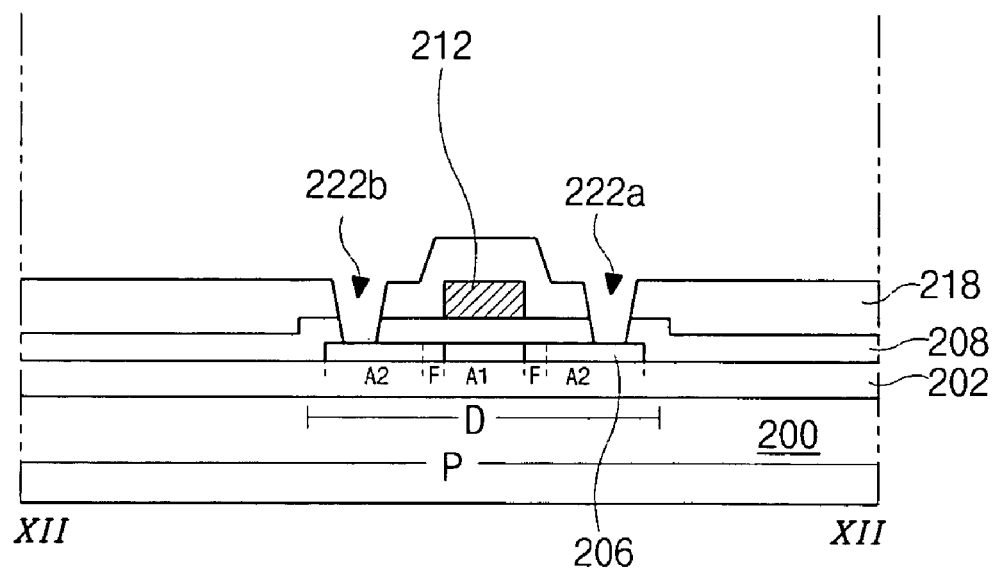

In FIGS. 11D and 12D, after the PR pattern 216 is removed, an interlayer insulating layer 218 is disposed on the plurality of switching gate electrodes 210a, 210b and 210c and the driving gate electrode 212 by depositing an inorganic insulating material such as silicon nitride (SiNx) and silicon oxide (SiO$_2$). A switching source contact hole 220a, a switching drain contact hole 220b, a driving source contact hole 222a and a driving drain contact hole 222b are defined through the interlayer insulating layer 218 by patterning. The switching source contact hole 220a and the switching drain contact hole 220b expose the second portion "A2" of the switching active layer 204, and the driving source contact hole 222a and the driving drain contact hole 222b expose the second portion "A2" of the driving active layer 206. In addition, a gate contact hole 224 is simultaneously defined through the interlayer insulating layer 218 exposing the driving gate electrode 212 in the driving region "D."

Figure 11E:
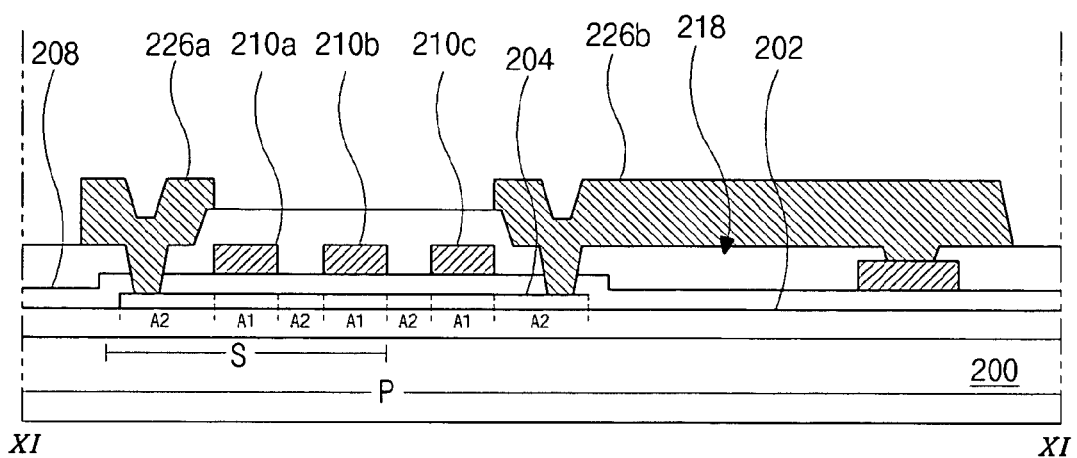
Figure 12E:
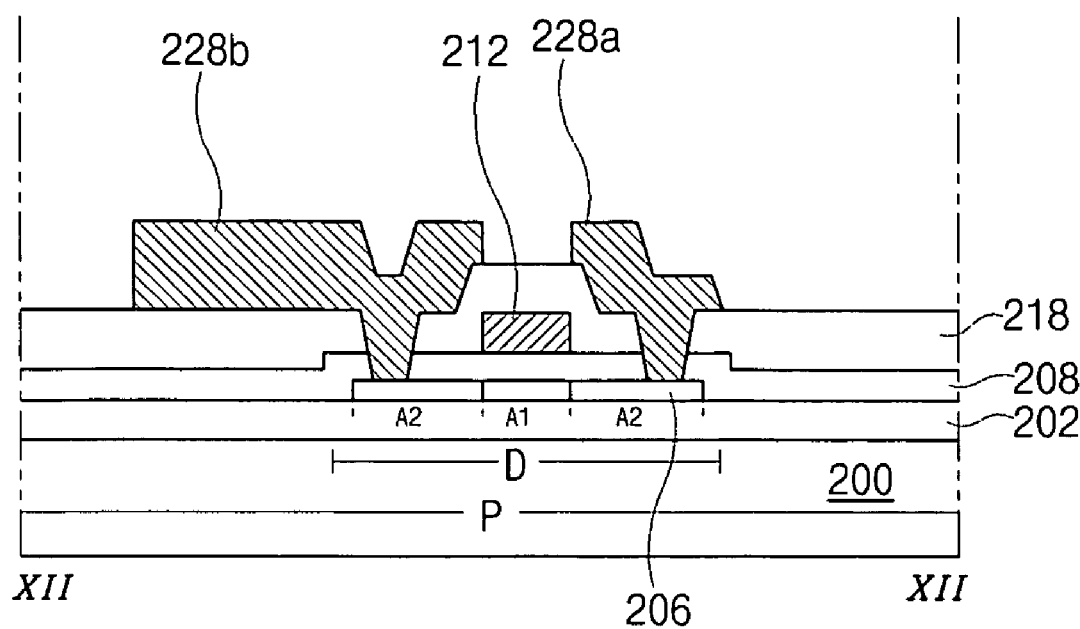

In FIGS. 11E and 12E, a switching source electrode 226a, a switching drain electrode 226b, a driving source electrode 228a and a driving drain electrode 228b are disposed on the interlayer insulating layer 218 by depositing and patterning at least one of a conductive metallic material group material including chromium (Cr), molybdenum (Mo), titanium (Ti), aluminum (Al), aluminum alloy, tungsten (W), tantalum (Ta) and molybdenum tungsten alloy (MoW). The switching source electrode 226a and the switching drain electrode 226b are connected to the second active portion "A2" of the switching active layer 204 within the switching source contact hole 220a and the switching drain contact hole 220b, respectively. In addition, the driving source electrode 228a and the driving drain electrode 228b are connected to the second active portion "A2" of the driving active layer 206 through the driving contact hole 222a and the driving drain contact hole 222b, respectively. At the same time, a portion of a data line "DL" (of FIG. 10) connected to the switching source electrode 226a in the switching region "S" is disposed on the interlayer insulating layer 218.

Figure 11F:
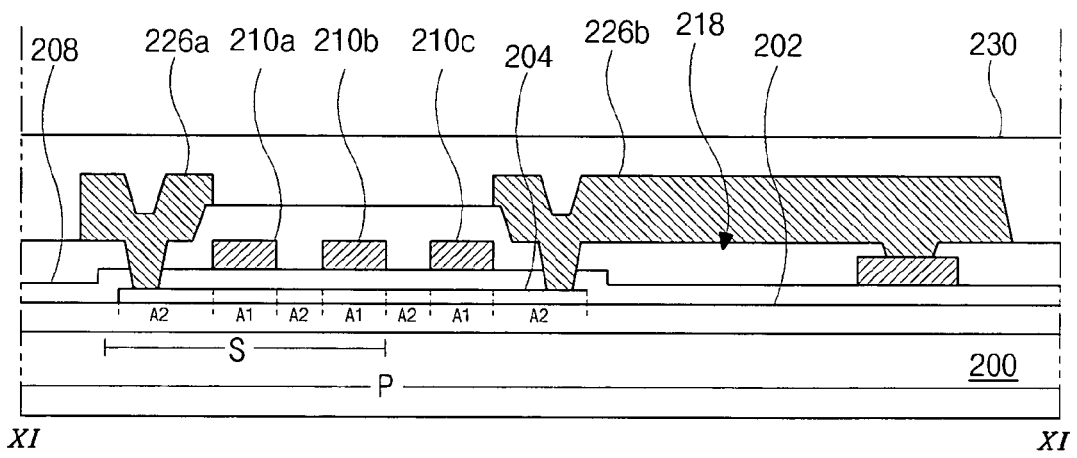
Figure 12F:
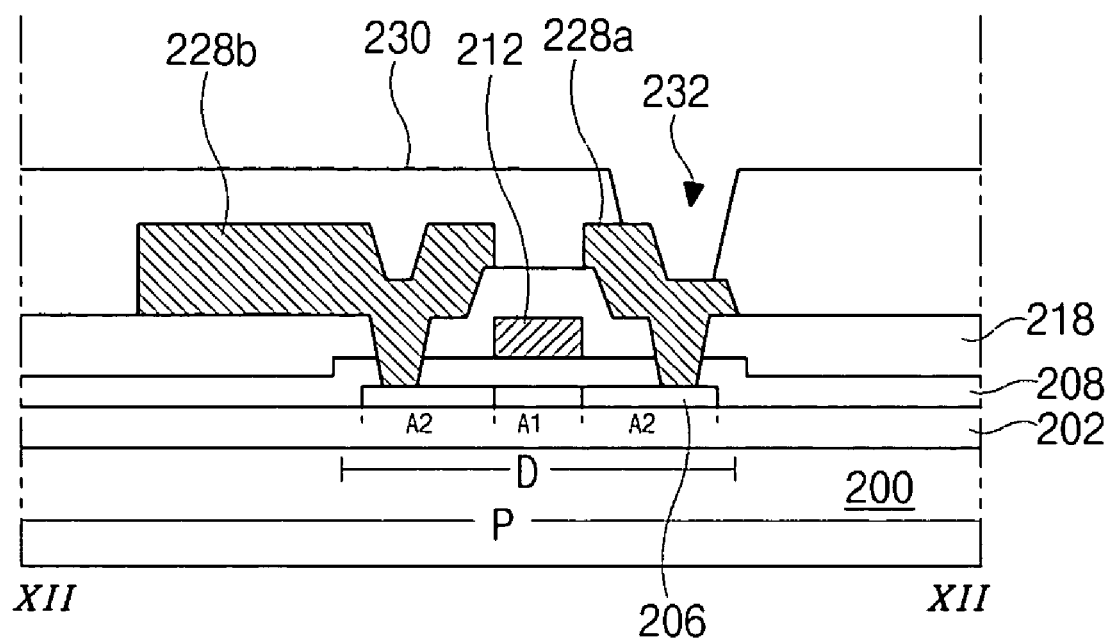

In FIGS. 11F and 12F, a first passivation layer 230 is disposed on the switching source electrode 226a, the switching drain electrode 226b, the driving source electrode 228a and the driving drain electrode 228b by depositing one of an inorganic insulating material such as silicon nitride (SiNx) and silicon oxide (SiO$_2$), and an organic insulating material such as benzocyclobutene (BCB) and acrylic resin. A source contact hole 232 exposing the driving source electrode 228a in the driving region "D" is defined through the first passivation layer 230.

Figure 11G:
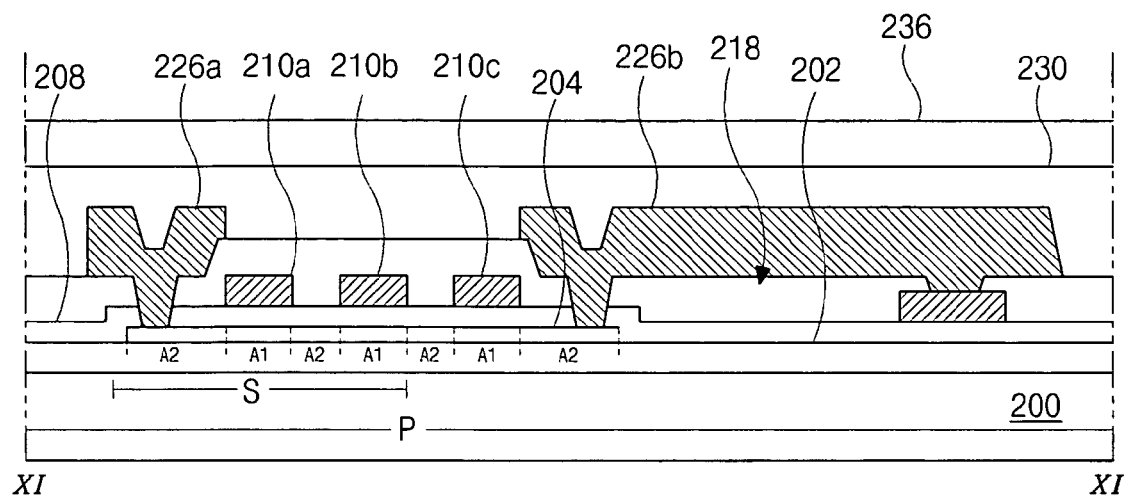
Figure 12G:
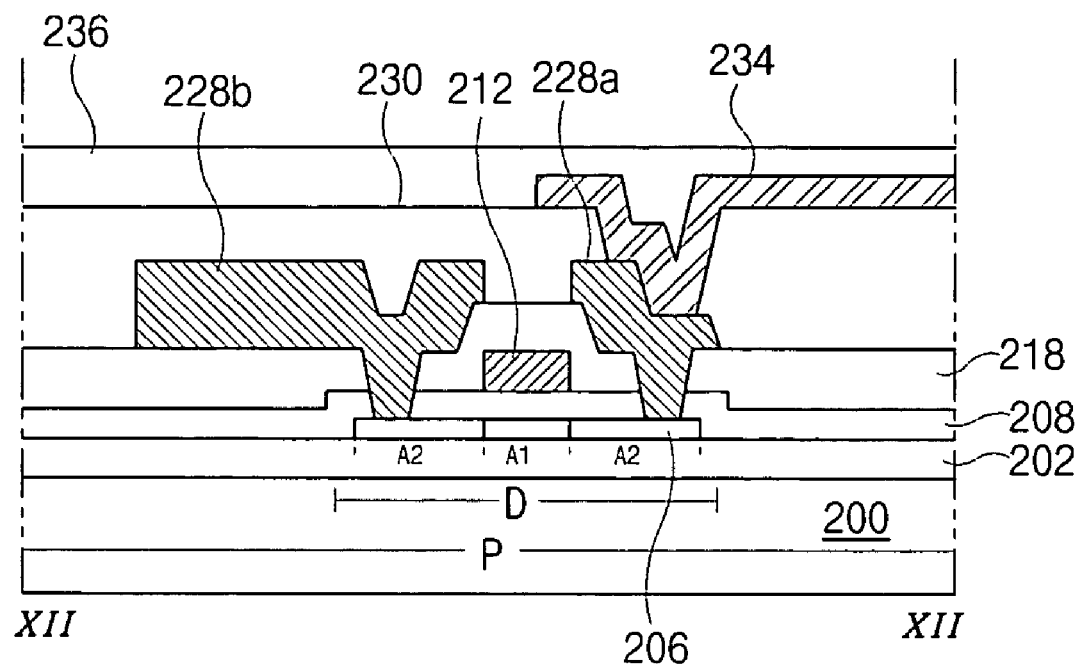

In FIGS. 11G and 12G, a ground line 234 is disposed on the first passivation layer 230 by depositing and patterning at least one of a conductive metallic material group material including chromium (Cr), molybdenum (Mo), titanium (Ti), aluminum (Al), aluminum alloy, tungsten (W), tantalum (Ta) and molybdenum tungsten alloy (MoW). The ground line 234 is connected to the driving source electrode 228a in the driving region "D" through the source contact hole 232. The ground line 234 may be simultaneously disposed with the driving gate electrode 212 and then may be connected to the driving source electrode 228a in a subsequent process in another embodiment. In addition, a second passivation layer 236 is disposed on the ground line 234 by depositing one of an inorganic insulating material such as silicon nitride (SiNx) and silicon oxide (SiO$_2$), and an organic insulating material such as benzocyclobutene (BCB) and acrylic resin.

Figure 11H:
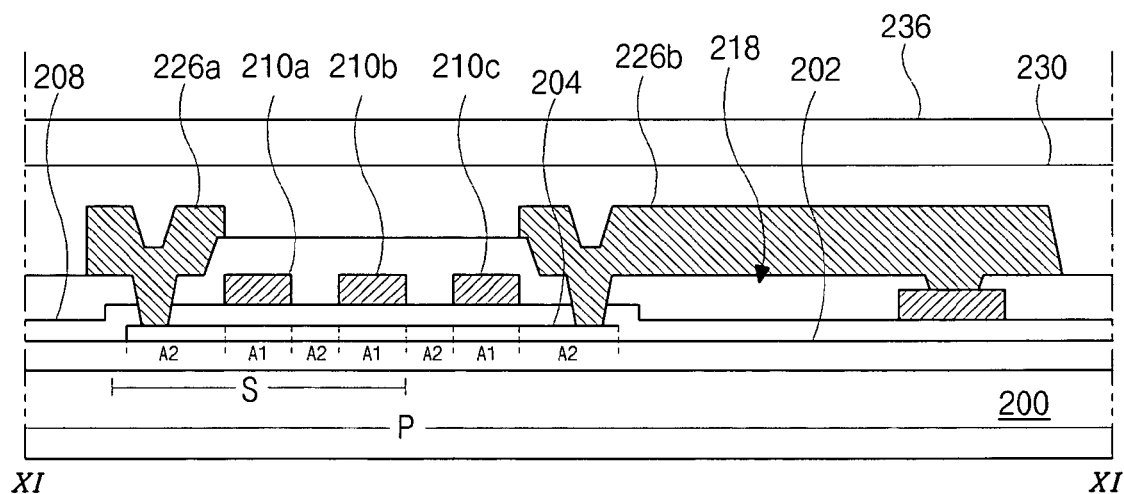
Figure 12H:
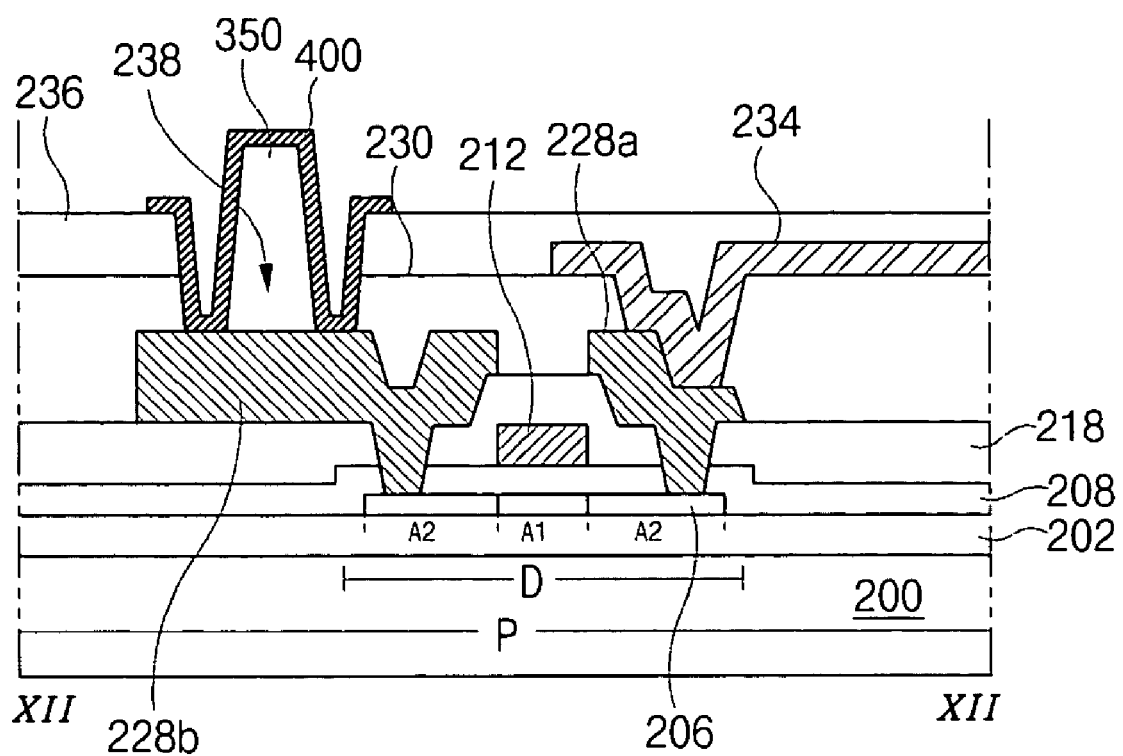

In FIGS. 11H and 12H, a drain contact hole 238 exposing the driving drain electrode 228b in the driving region "D" is defined through the first and second passivation layers 230 and 236. Then, a connection electrode 400 is disposed on the second passivation layer 236 to connect a driving element "T$_D$" (of FIG. 9) and an organic EL diode "E" (of FIG. 9). The connection electrode 400 is connected to the driving drain electrode 228b within the drain contact hole 238. An organic material pattern 350 may be disposed within the drain contact hole 238. Thereafter, the connection electrode 400 may be disposed on the organic material pattern 350. A portion of the organic material pattern 350, having the connection electrode 400 disposed thereon, may protrude from the drain contact hole 238 to help connect the connection electrode 400 and a second electrode 260 (of FIG. 8) of the organic EL diode "E" (of FIG. 8). Accordingly, the organic material pattern 350 may have a height matching to a space between the array substrate "AS" (of FIG. 8) and the electroluminescent substrate "ES" (of FIG. 8).

An array substrate "AS" (of FIG. 8) fabricated through a process shown in FIGS. 11A to 11H and 12A to 12H may be attached to an electroluminescent substrate "ES" (of FIG. 8), thereby completing a dual plate type organic EL device according to the second exemplary embodiment of the present invention. In the organic EL device according to the second exemplary embodiment of the present invention in which a plurality of N-type p-Si TFTs are used as a switching element and a plurality of N-type p-Si TFTs are used as a driving element. Since a plurality of N-type p-Si TFTs in series have a lower leakage current than an N-type a-Si TFT, characteristics of a switching element are improved. In addition the leakage current of the switching element is further reduced, when the plurality of N-type p-Si TFTs have an LDD structure. Furthermore, since the stress resulting from the increased current density is distributed to the plurality of N-type p-Si TFTs in parallel, the deterioration of the driving element is prevented, and lifetime of the driving element is improved.

In an organic electroluminescent device according to the present invention, array elements and an organic EL diode are disposed on the respective substrate to improve the production yield and production management efficiency, and lifetime of an organic EL device is lengthened. Furthermore, having a top emission type ELD enables the simpler TFT design. Accordingly, an increased aperture ratio can be obtained regardless of lower array patterns. Moreover, distribution of the stress resulting from the increased current density is implemented by the plurality of N-type p-Si TFTs in parallel, deterioration of the driving element is prevented and the lifetime of the driving element is improved. In addition, a P-type p-Si TFT or a plurality of N-type p-Si TFTs in series are used as a switching element, a leakage current of the switching element is reduced and characteristics of the switching element are improved.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   first and second substrates facing and spaced apart from each other;
   a gate line on the first substrate;
   a data line intersecting the gate line to define a pixel region;
   a switching element connected to the gate line and the data line;
   an organic electroluminescent diode on the second substrate;
   a driving element connected to the switching element and the organic electroluminescent diode, the driving element including a plurality of driving negative-type polycrystalline silicon thin film transistors connected to the organic electroluminescent diode in parallel, the driving element including a driving drain electrode;
   at least one passivation layer on the driving element, the at least one passivation element including a drain contact hole exposing the drain electrode;
   an organic material pattern on the driving element, the organic material pattern disposed directly within the drain contact hole; and
   a connection electrode on the organic material pattern, the connection electrode connecting the driving element and the organic electroluminescent diode, wherein the connection electrode wraps the organic material pattern such that the connection electrode contacts a portion of the driving drain electrode exposed outside a boundary portion of the organic material pattern, and wherein the organic material pattern is disposed between the drain electrode and the connection electrode.

2. The device according to claim 1, wherein the driving element includes a driving active layer of polycrystalline silicon, a driving gate electrode over the driving active layer, a driving source electrode and the driving drain electrode contacting side portions of the driving active layer.

3. The device according to claim 2, wherein the driving active layer includes a plurality of openings corresponding to the driving gate electrode.

4. The device according to claim 2, wherein the side portions include negative-type impurities.

5. The device according to claim 1, further comprising a storage capacitor connected to the switching element and the driving element in parallel.

6. The device according to claim 1, further comprising a ground line connected to the driving element.

7. The device according to claim 1, wherein the organic electroluminescent diode comprises:
   a first electrode on the second substrate;
   an organic luminescent layer on the first electrode; and
   a second electrode on the organic luminescent layer.

8. The device according to claim 7, wherein the organic luminescent layer comprises:
   a hole injection layer on the first electrode;
   an emitting material layer on the hole injection layer; and
   an electron injection layer on the emitting material layer.

9. The device according to claim 7, wherein the first electrode and the second electrode function as an anode and a cathode, respectively.

10. The device according to claim 1, wherein the switching element includes a positive-type polycrystalline silicon thin film transistor.

11. The device according to claim 10, wherein the switching element includes a switching active layer of polycrystalline silicon, a switching gate electrode over the switching active layer, a switching source electrode and a switching drain electrode contacting side portions of the switching active layer.

12. The device according to claim 11, wherein the side portions include positive-type impurities.

13. The device according to claim 1, wherein the switching element includes a plurality of switching negative-type polycrystalline silicon thin film transistors connected to the data line in series.

14. The device according to claim 13, wherein the switching element includes a switching active layer of polycrystalline silicon, a plurality of switching gate electrodes over the switching active layer, a switching source electrode and a switching drain electrode contacting side portions of the switching active layer.

15. The device according to claim 14, wherein the plurality of switching gate electrodes are connected to the gate line, the side portions are doped with negative-type impurities.

16. The device according to claim 15, wherein the side portions form first and second portions and an impurity concentration of the first portion is less than an impurity concentration of the second portion.

17. A fabricating method of an organic electroluminescent device, comprising:
   disposing a gate line on a first substrate;
   disposing a data line intersecting the gate line to define a pixel region;
   forming a switching element on the first substrate connected to the gate line and the data line;
   forming an organic electroluminescent diode on a second substrate;
   forming a driving element on the first substrate connected to the switching element and the organic electroluminescent diode, and the driving element including a plurality of driving negative-type polycrystalline silicon thin film transistors connected to the organic electroluminescent diode in parallel, the driving element including a driving drain electrode;
   forming at least one passivation layer on the driving element, the at least one passivation element including a drain contact hole exposing the driving drain electrode;

forming an organic material pattern on the driving element, the organic material pattern disposed directly within the drain contact hole;

forming a connection electrode on the organic material pattern, wherein the connection electrode wraps the organic material pattern such that the connection electrode contacts a portion of the driving drain electrode exposed outside a boundary portion of the organic material pattern, and wherein the organic material pattern is disposed between the drain electrode and the connection electrode; and attaching the first and second substrates such that the driving element is electrically connected to the organic electroluminescent diode through the connection electrode.

18. The method according to claim 17, wherein forming the driving element comprises:

disposing a driving active layer of polycrystalline silicon;

disposing a driving gate electrode over the driving active layer; and disposing a driving source electrode and the driving drain electrode contacting side portions of the driving active layer.

19. The method according to claim 18, wherein the driving active layer includes a plurality of openings corresponding to the driving gate electrode.

20. The method according to claim 17, further comprising doping the side portions with negative-type impurities.

21. The method according to claim 17, further comprising forming a storage capacitor connected to the switching element and the driving element in parallel.

22. The method according to claim 17, further comprising disposing a ground line connected to the driving element.

23. The method according to claim 17, wherein forming the organic electroluminescent diode comprises:

disposing a first electrode on the second substrate;

disposing an organic luminescent layer on the first electrode; and disposing a second electrode on the organic luminescent layer.

24. The method according to claim 23, wherein forming the organic luminescent layer comprises:

disposing a hole injection layer on the first electrode;

disposing an emitting material layer on the hole injection layer; and disposing an electron injection layer on the emitting material layer.

25. The method according to claim 23, wherein the first electrode and the second electrode function as an anode and a cathode, respectively.

26. The method according to claim 17, wherein the switching element includes a positive-type polycrystalline silicon thin film transistor.

27. The method according to claim 26, wherein forming the switching element comprises:

disposing a switching active layer of polycrystalline silicon;

disposing a switching gate electrode over the switching active layer; and disposing a switching source electrode and a switching drain electrode contacting side portions of the switching active layer.

28. The method according to claim 27, further comprising doping the side portions with positive-type impurities.

29. The method according to claim 17, wherein the switching element includes a plurality of switching negative-type polycrystalline silicon thin film transistors connected to the data line in series.

30. The method according to claim 29, wherein forming the switching element comprises:

disposing a switching active layer of polycrystalline silicon;

disposing a plurality of switching gate electrodes over the switching active layer; and disposing a switching source electrode and a switching drain electrode contacting side portions of the switching active layer.

31. The method according to claim 30, wherein the plurality of switching gate electrodes connected to the gate line.

32. The method according to claim 30, further comprising doping the side portions with negative-type impurities.

33. A fabricating method of an organic electroluminescent device, comprising:

disposing a switching active layer and a driving active layer on a first substrate, the driving active layer including a plurality of openings;

disposing at least one switching gate electrode over the switching active layer, a driving gate electrode over the driving active layer and a gate line connected to the at least one switching gate electrode, the driving gate electrode crossing the plurality of openings;

doping side portions of the driving active layer with negative type impurities;

disposing a switching source electrode, a switching drain electrode, a driving source electrode, a driving drain electrode and a data line intersecting the gate line to define a pixel region, the switching source electrode and the switching drain electrode contacting side portions of the switching active layer, the driving source electrode, and the driving drain electrode contacting the side portions of the driving active layer, the data line being connected to the switching source electrode;

disposing at least one passivation layer on the switching source electrode, the switching drain electrode, the driving source electrode and the driving drain electrode, the at least one passivation element including a drain contact hole exposing the drain electrode;

disposing an organic material pattern on the driving drain electrode, the organic material pattern disposed directly within the drain contact hole;

disposing a connection electrode on the organic material pattern, wherein the connection electrode wraps the organic material pattern such that the connection electrode contacts a portion of the driving drain electrode exposed outside a boundary portion of the organic material pattern, and wherein the organic material pattern is disposed between the driving drain electrode and the connection electrode;

disposing a first electrode on a second substrate;

disposing an organic luminescent layer on the first electrode;

disposing a second electrode on the organic luminescent layer; and attaching the first and second substrates such that the driving drain electrode is electrically connected to the second electrode through the connection electrode.

34. The method according to claim 33, further comprising disposing a ground line connected to the driving source electrode.

35. The method according to claim 33, wherein the at least one switching gate electrode is a single switching gate electrode.

36. The method according to claim 35, further comprising doping the side portions of the switching active layer with positive-type impurities.

37. The method according to claim 33, wherein the at least one switching gate electrode is from a plurality of switching gate electrodes.

38. The method according to claim 37, further comprising doping the side portions of the switching active layer with negative-type impurities.

39. The method according to claim 38, wherein the side portions of the driving active layer and the side portions of the switching active layer are simultaneously doped with the negative impurities.

* * * * *